(12) United States Patent
Zhao

(10) Patent No.: US 6,423,986 B1
(45) Date of Patent: *Jul. 23, 2002

(54) FIELD-CONTROLLED HIGH-POWER SEMICONDUCTOR DEVICES

(75) Inventor: Jian J. Zhao, North Brunswick, NJ (US)

(73) Assignee: Rutgers, The State University, New Brunswick, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 09/719,327
(22) PCT Filed: Jun. 10, 1999
(86) PCT No.: PCT/US99/13253
§ 371 (c)(1),
(2), (4) Date: Dec. 8, 2000
(87) PCT Pub. No.: WO99/65082
PCT Pub. Date: Dec. 16, 1999

Related U.S. Application Data

(63) Continuation-in-part of application No. 09/095,481, filed on Jun. 10, 1998, now Pat. No. 6,107,649.

(51) Int. Cl.$^7$ ............................................. H01L 29/87
(52) U.S. Cl. .................. 257/138; 257/139; 257/133; 257/110; 257/147; 257/134
(58) Field of Search ............................... 257/138, 139, 257/110, 133, 147, 134

(56) References Cited

U.S. PATENT DOCUMENTS 4,827,321 A * 5/1989 Baliga ........................ 357/37
4,912,541 A    3/1990 Baliga et al. ................ 357/38
4,959,703 A    9/1990 Ogura et al. ................. 357/38
5,005,065 A    4/1991 Piccone et al. .............. 357/38
5,021,855 A    6/1991 Oikawa et al. .............. 357/38

(List continued on next page.)

OTHER PUBLICATIONS

High–Voltage Double–Implanted Power MOSFET's in 6H–SiC, Jayarama N. Shenoy, James A. Cooper, Jr. and Michael R. Melloch, IEEE Electronic Device Letters, vol. 18, No. 3 Mar. 1997.*

(List continued on next page.)

Primary Examiner—Jerome Jackson, Jr.
(74) Attorney, Agent, or Firm—Lerner, David, Littenberg, Krumholz & Mentlik, LLP

(57) ABSTRACT

Power semiconductor devices have a plurality of semiconductor layers of alternating p-type and n-type conductivity and top and bottom device surfaces. The top semiconductor layer forms a control layer (60). A semiconductor layer junction, remote from both device surfaces, forms a blocking p-n junction (54) capable of sustaining the applied device voltage. A top ohmic contact overlays a top conductive region (64) extending from the top surface into the control layer (60). A conductive tub region (62), spaced apart from the top conductive region (64), extends from the top surface at least through the control layer (60). A field effect region (80) is disposed in the control layer (60) between the top conductive region (64) and tub region (62). A gate contact (18) is formed over the field effect region (80) causing the creation and interruption of a conductive channel (82) between the top conductive region (64) and conductive tub region (62) so as to turn the device on and off.

65 Claims, 20 Drawing Sheets

U.S. PATENT DOCUMENTS

| | | | |
|---|---|---|---|
| 5,153,695 A | | 10/1992 | Gobrecht et al. ............. 357/38 |
| 5,338,945 A | * | 8/1994 | Baliga ......................... 257/77 |
| 5,412,228 A | * | 5/1995 | Baliga ........................ 257/133 |
| 5,448,081 A | | 9/1995 | Malhi .......................... 257/77 |
| 5,449,938 A | * | 9/1995 | Stockmeier et al. ........ 257/356 |
| 5,451,797 A | * | 9/1995 | Davis et al. .................. 257/77 |
| 5,461,242 A | | 10/1995 | Muraoka et al. ............ 257/136 |
| 5,486,484 A | | 1/1996 | Malhi .......................... 437/41 |
| 5,510,281 A | | 4/1996 | Ghezzo et al. ................ 437/41 |
| 5,539,217 A | * | 7/1996 | Edmond et al. .............. 257/77 |
| 5,543,637 A | * | 8/1996 | Baliga ......................... 257/77 |
| 5,569,949 A | * | 10/1996 | Malhi ......................... 257/397 |
| 5,614,737 A | * | 3/1997 | Piccone ...................... 257/124 |
| 5,625,203 A | | 4/1997 | Lilja .......................... 257/132 |
| 5,665,987 A | | 9/1997 | Muraoka et al. ............ 257/133 |
| 5,681,762 A | * | 10/1997 | Baliga ......................... 437/22 |
| 5,682,044 A | | 10/1997 | Tamamushi et al. ........ 257/147 |
| 5,686,755 A | * | 11/1997 | Malhi ......................... 257/492 |
| 5,723,891 A | * | 3/1998 | Malhi ......................... 257/341 |

OTHER PUBLICATIONS

Critical Materials, Device Design, Performance and Reliability Issues in 4H–SIC Power Umofset Structures, A.K. Agarwal, et al., 1996 Materials Research Society, Mat. Res. Soc. Symp. Proc., vol. 423, pp. 87–92.*

SiC Power Device Development; A.K. Agarwal, et al., All Electric Combat Vehicle—Second International Congress Jun. 8–12, 1997—Dearborn, Michigan, pp. 13–19.*

*Recent Advances in SiC Power Devices*, James A. Cooper, Jr., School of Electrical and Computer Engineering, Purdue University.

*1100 V 4H–SiC Power MOSFETs*, A.K.Agarwal et al., Apr. 11, 1997, Submitted to International Conference on Silicon Carbide, III–nitrides and Related Materials—1997, Aug. 31–Sep. 5, 1997, Sweden.

700–V Asymmetrical 4H–SiC Gate Turn–Off Thyristors (GTO's), A.K. Agrawal et al., IEEE Electron Device Letters, vol. 18, No. 11, Nov. 1997, pp. 518–520.

* cited by examiner

FIELD-CONTROLLED HIGH-POWER SEMICONDUCTOR DEVICES

CROSS-REFERENCE TO RELATED APPLICATIONS

This application is a continuation-in-part of U.S. application Ser. No. 09/095,481 filed Jun. 10, 1998, now U.S. Pat. No. 6,107,649, Issued Aug. 22, 2000.

TECHNICAL FIELD

This invention relates to power semiconductor devices, and more particularly relates to power semiconductor devices in which a p-n junction, remote from the device surfaces, carries the device operating voltage and field effect gates are used to control the device operation.

BACKGROUND ART

Power semiconductors, as distinguished from signal semiconductors, are used to process and control the flow of electric energy supplied to user loads. The utility of such devices is driven by their ability to quickly and efficiently switch on and off large operating voltages and currents. Power semiconductor switching devices are increasingly being designed to handle applications requiring high blocking voltages in the off condition, typically 1 kV and greater, and high current requirements in the on state, typically 1 A and greater. Recent advances in device operating thresholds, however, have imposed operational and fabrication-related problems for power semiconductor devices.

Historically, power semiconductor devices have required large switching currents to handle the corresponding high device currents. Large switching currents result in device inefficiencies since excessive electrical power is required to operate the device. Power semiconductor devices to-date have employed metal-oxide-semiconductor (MOS) gate structures in a variety of arrangements to achieve the low current turn-on and turn-off requirements of these devices. However, MOS gates have experienced operational and fabrication-related reliability problems as the operational boundaries of the power semiconductor devices have been expanded. In particular, the high operating device voltages create large electric fields within these devices, which poses long-term reliability problems for the oxides used in the MOS gates. Trenched MOS gates (UMOS), as found in the paper by A. K. Agarwal et al. entitled SiC Power Device Development given at the All Electric Combat Vehicle (AECV) Second International Conference Jun. 8th–12th 1997, and buried structures, U.S. Pat. No. 5,543,637, have been employed to partially overcome these oxide limitations. In each of these arrangements, however, large electric fields are still present at the oxide interfaces thereby compromising the long-term oxide reliability. Finally, gate oxides are often fabricated on implanted semiconductor regions, which results in low oxide quality and reliability, particularly in power devices fabricated from SiC. An exemplary high-power thyristor device employing such a MOS gate structure can be found in the above article by A. K. Agarwal.

The need exists for monolithic, simply constructed, easily fabricated, power semiconductor devices in which the controlling gate structures are fabricated without oxides or dielectric insulators and are removed from the large electric fields within the device. Although non-oxide gate structures are preferred, the need also exists to provide a reliable, non-implanted semiconductor surface on which to fabricate gate oxides, for those power semiconductors which continue to employ MOS gates, and to isolate such gate oxide from the large electric field stresses.

SUMMARY OF THE INVENTION

A preferred embodiment according to the present invention provides for a semiconductor device comprising: (a) a semiconductor structure having top and bottom surfaces, the structure including a plurality of semiconductor layers defining a blocking p-n junction remote from both the surfaces, the structure including a control layer defining the top surface of the structure; a top conductive region extending from the top surface; a conductive tub region spaced apart from the top conductive region and extending from the top surface toward the blocking p-n junction at least through the control layer, the control layer including a field effect region disposed between the top conductive region and the conductive tub region; (b) a top ohmic contact in contact with the top surface at the top conductive region; (c) a bottom ohmic contact in contact with the semiconductor structure below the blocking p-n junction, the semiconductor layers being arranged so that when a potential is sustained between the top and bottom ohmic contacts, a major portion of the potential appears across the blocking p-n junction thereby forming depletion regions about the blocking p-n junction, and (d) a gate contact overlying the field effect region, whereby conductivity of the field effect region can be selectively controlled by a controlling potential on the gate contact to create and interrupt a conductive channel within the control layer, the top conductive region and the conductive tub region being coupled and decoupled by the conductive channel, the conductive tub region extending downwardly to the vicinity of the blocking p-n junction so that a least resistive current path including the top conductive region, the conductive channel and the conductive tub region is created between the top ohmic contact and the blocking p-n junction when the conductive channel is created.

In yet another embodiment, the semiconductor device further comprises a control p-n junction disposed above the blocking p-n junction and remote from the top surface, the gate contact forming a Schottky contact such that the gate contact, the field effect region, the top conductive region and the conductive tub region constitute a MESFET. Alternatively, the semiconductor device may further comprise a control p-n junction disposed above the blocking p-n junction and remote from the top surface, the field effect region having a gate conductive region extending from the top surface under the gate contact toward the control p-n junction such that the gate contact, the gate conductive region, the field effect region, the top conductive region and the conductive tub region constitute a JFET. Alternatively, the semiconductor device may further comprise a control p-n junction disposed above the blocking p-n junction and remote from the top surface, the gate contact including an insulative layer on the top surface and a conductive contact on the insulative layer such that the gate contact, the field effect region, the top conductive region and the conductive tub region constitute a MOSFET. Yet another embodiment includes the semiconductor device in which the top conductive region includes a first subregion of same semiconductor type as the control layer and extending to a first depth from the top surface, a second subregion of opposite semiconductor type from the control layer extending to a second depth from the top surface and disposed between the first subregion and the field effect region, both of the subregions being in contact with the top ohmic contact, the gate contact including an insulative layer on the top surface and a conductive contact on the insulative layer such that the gate contact, the field effect region, the second subregion of the top conductive region and the conductive tub region constitute a MOSFET.

Additional embodiments of the invention include the semiconductor device in which the field effect region includes unimplanted epitaxially grown semiconductor defining the top surface in the field effect region, whereby the insulative layer includes an insulating compound on the unimplanted epitaxially grown semiconductor.

In one preferred embodiment, the semiconductor device may also be arranged such that the semiconductor device is a field controlled transistor, the conductive tub region extending at least to the blocking p-n junction and having a bottom end being disposed in the depletion region of the blocking p-n junction when the potential is sustained between the top and bottom ohmic contacts, the conductive tub region being alternatively depleted and undepleted of carriers in response to the selective controlling potential on the gate contact, whereby the transistor switches "off" and "on" respectively. In this embodiment the semiconductor device may have the top conductive region including a first subregion of same semiconductor type as the control layer and extending to a first depth from the top surface; a second subregion of opposite semiconductor type from the control layer extending to a second depth from the top surface and disposed between the first subregion and the field effect region, both subregions in contact with the top ohmic contact, the gate contact including an insulative layer on the top surface and a conductive contact on the insulative layer such that the gate contact, the field effect region, the second subregion of the top conductive region and the conductive tub region constitute a MOSFET. Alternatively, the semiconductor device further comprises a control p-n junction disposed above the blocking p-n junction and remote from the top surface, the gate contact forming a Schottky contact such that the gate contact, the field effect region, the top conductive region and the conductive tub region constitute a MESFET. Alternatively, the semiconductor further comprises a control p-n junction disposed above the blocking p-n junction and remote from the top surface, the field effect region having a gate conductive region extending from the top surface under the gate contact toward the control p-n junction such that the gate contact, the gate conductive region, the field effect region, the top conductive region and the conductive tub region constitute a JFET. In yet other preferred embodiments, the semiconductor device comprises a control p-n junction disposed above the blocking p-n junction and remote from the top surface, the gate contact including an insulative layer on the top surface and a conductive contact on the insulative layer such that the gate contact, the field effect region, the top conductive region and the conductive tub region constitute a MOSFET.

In an additional preferred embodiment is provided the semiconductor in which the semiconductor device is a field-gated bipolar transistor, the semiconductor structure having a lower p-n junction remote from the top and bottom surfaces and disposed below the blocking p-n junction, the conductive tub region extending at least to the blocking p-n junction and having a bottom end being disposed in the depletion region of the blocking p-n junction when the potential is sustained between the top and bottom ohmic contacts, the conductive tub region being alternatively depleted and undepleted in response to the selective controlling potential on the gate contact, whereby the bipolar transistor switches "off" and "on" respectively. This embodiment may further include a semiconductor device in which the top conductive region includes a first subregion of same semiconductor type as the control layer and extending to a first depth from the top surface, a second subregion of opposite semiconductor type from the control layer extending to a second depth from the top surface and disposed between the first subregion and the field effect region, both subregions in contact with the top ohmic contact, the gate contact including an insulative layer on the top surface and a conductive contact on the insulative layer such that the gate contact, the field effect region, the second subregion of the top conductive region and the conductive tub region constitutes a MOSFET. In another variation, the semiconductor device may further comprise a control p-n junction disposed above the blocking p-n junction and remote from the top surface, the gate contact forming a Schottky contact such that the gate contact, the field effect region, the top conductive region and the conductive tub region constitute a MESFET. In yet another variation, the semiconductor device further comprised a control p-n junction disposed above the blocking p-n junction and remote from the top surface, the field effect region having a gate conductive region extending from the top surface under the gate contact toward the control p-n junction such that the gate contact, the field effect region, the gate conductive region, the top conductive region and the conductive tub region constitute a JFET. In a final variation of this type, the semiconductor device further comprises a control p-n junction disposed above the blocking p-n junction and remote from the top surface, the gate contact including an insulative layer on the top surface and a conductive contact on the insulative layer such that the gate contact, the field effect region, the top conductive region and the conductive tub region constitute a MOSFET.

In an additional preferred embodiment is provided the semiconductor device in which the semiconductor device is a field turn-off thyristor; (a) the top conductive region including a first subregion extending to a first depth from the top surface, and a second subregion extending to a second depth from the top surface and disposed between the first subregion and the field effect region, both subregions in contact with the top ohmic contact; (b) the semiconductor structure having a lower and an upper p-n junction, both remote from the top and bottom surfaces; the lower p-n junction disposed below the blocking p-n junction, the upper p-n junction disposed above the blocking p-n junction, the conductive tub region extending at least through the upper p-n junction; a latch-on gate ohmic contact overlying the conductive tub region at the top surface, whereby when the conductive channel is interrupted, current flow through the conductive tub region can be selectively controlled by a controlling current applied through the latch-on gate ohmic contact to turn on the upper p-n junction and thereby switch "on" the thyristor; and whereby in an absence of the controlling current on the latch-on gate contact, the controlling potential on the gate contact can create the conductive channel to bypass the upper p-n junction and thereby switch "off" the thyristor. In one variation, the semiconductor device has the first subregion of same semiconductor type as the control layer, the second subregion is of opposite semiconductor type from the control layer, the gate contact including an insulative layer on the top surface and a conductive contact on the insulative layer such that the gate contact, the field effect region, the second subregion of the top conductive region and the conductive tub region constitute a MOSFET. In another variation, the semiconductor device further comprises a control p-n junction disposed above the upper p-n junction and remote from the top surface, the first subregion being of opposite semiconductor type from the control layer, the second subregion of same semiconductor type as the control layer, the first depth of the first subregion extending beyond the control p-n junction from the top surface, the gate contact forming a Schottky contact such that the gate contact, the field effect region, the second subregion of the top conductive region and the conductive tub region constitute a MESFET. In yet another variation, the semiconductor device further comprises a control p-n junction disposed above the upper p-n junction and remote from the top surface, the first subregion being of opposite semiconductor type from the control layer, the second subregion of same semiconductor type as the control layer, the first depth of the first subregion extending beyond the control p-n junction from the top surface, the field effect region further comprises a gate conductive region extending from the top surface under the gate contact toward the control p-n junction such that the gate contact, the field effect region, the gate conductive region, the second subregion of the top conductive region and the conductive tub region constitute a JFET. In a final variation of this type, the semiconductor device further comprises a control p-n junction disposed above the upper p-n junction and remote from the top surface, the first subregion being of opposite semiconductor type from the control layer, the second subregion of same semiconductor type as the control layer, the first depth of the first subregion extending beyond the control p-n junction from the top surface, the gate contact including an insulative layer on the top surface and a conductive contact on the insulative layer such that the gate contact, the field effect region, the second subregion of the top conductive region and the conductive tub region constitute a MOSFET.

In additional embodiments of the invention, the semiconductor device includes a semiconductor structure further comprising a blocking layer of relatively low doping concentration disposed below the blocking p-n junction and an enhancement layer of same semiconductor type and relatively higher doping concentration as the blocking layer disposed above the lower p-n junction. Also, the semiconductor device may have the top conductive region including a first subregion of opposite semiconductor type from the control layer and extending through the control p-n junction from the top surface, and a second subregion of the same semiconductor type as the control layer extending to a second depth from the top surface and disposed between the first subregion and the field effect region, both of the subregions in contact with the top ohmic contact. The semiconductor device may also have semiconductor layers composed of a material selected from the group consisting of SiC, Si, Diamond, GaAs, GaN, AlN, AlGaN, InGaN, GaP, AlGaP or AlGaAsP and combinations thereof Additionally, the semiconductor device includes semiconductor layers including a bottom layer, the bottom layer being in contact with the bottom ohmic contact and further including a buffer layer for improving the semiconductor structure quality.

In yet additional embodiments, the semiconductor device has no insulative layer as part of the gate contact. Also, the semiconductor may further comprise a control p-n junction disposed above the blocking An junction and remote from the top surface, the field effect region including an unimplanted portion of the control layer. Also, the semiconductor device may further comprise a control p-n junction disposed above the blocking p-n junction and remote from the top surface; an upper p-n junction disposed between the blocking p-n junction and the control p-n junction. Additionally, the semiconductor device further comprises a lower p-n junction disposed below the blocking p-n junction and remote from the bottom surface. Also, the semiconductor device has the top conductive region including a first subregion of opposite semiconductor type from the control layer extending to a first depth at least through the control layer from the top surface; a second subregion of the same semiconductor type as the control layer extending to a second depth not through the control layer from the top surface and disposed between the first subregion and the field effect region, the first and second subregions being in contact with the top ohmic contact.

In other embodiments, the semiconductor device has the top conductive region including a first subregion of same semiconductor type as the control layer extending to a first depth not through the control layer from the top surface; a second subregion of opposite semiconductor type from the control layer and extends to a second depth, shallower than the first depth, from the top surface and disposed between the first subregion and the field effect region, both subregions being in contact with the top ohmic contact. Also, the semiconductor device may have the conductive tub region extending at least to the blocking p-n junction and has a bottom end disposed in the depletion region of the blocking p-n junction when the potential is sustained between the top and bottom ohmic contacts such that the field effect region is shielded from the potential. The semiconductor device may also further comprise a latch-on gate ohmic contact overlying the conductive tub region at the top surface. Additionally, the semiconductor device may further comprise a lower and an upper p-n junction, both remote from the top and bottom surfaces, the lower p-n junction disposed below the blocking p-n junction, the upper p-n junction disposed above the blocking p-n junction, the conductive tub region extending through the upper p-n junction; a latch-on gate ohmic contact overlaying the conductive tub region at the top surface, the semiconductor layers being of relative conductivity, whereby a latch-on current applied at the latch-on gate ohmic contact, flows through the conductive tub region and laterally beneath the upper p-n junction before traversing the upper p-n junction beneath the top ohmic contact.

In yet another embodiment of the present invention, the semiconductor device further comprises a semi-insulating layer disposed directly beneath the control layer and the field effect region; the conductive tub region extending at least through the semi-insulating layer, whereby the field effect region within the control layer is electrically isolated by the semi-insulating layer from a semiconductor layer directly beneath the semi-insulating layer in a direction perpendicular to the top surface. In variations in this embodiment, the semiconductor device may include the gate contact forming a Schottky contact such that the gate contact, the field effect region, the top conductive region and the conductive tub region constitute a MESFET, or the field effect region further including a gate conductive region extending from the top surface under the gate contact toward the semi-insulating layer such that the gate contact, the gate conductive region, the field effect region, the top conductive region and the conductive tub region constitute a JFET.

Further embodiments of the invention include the semiconductor device in which the conductive tub comprises a part of a blocking layer defining a lower semiconductor layer of the blocking p-n junction, or the semiconductor device in which the conductive tub comprises a part of the control layer, or the semiconductor device in which the conductive tub comprises an ion implanted region. extending from the top surface.

In a preferred method of the present invention, a method is provided for operating a semiconductor device having a plurality of semiconductor layers, a top and bottom surface and including a control layer defining the top layer of the device, the method comprising the steps of: (a) applying a voltage between a top and a bottom ohmic contact of the semiconductor device; (b) sustaining the voltage across a blocking p-n junction defined by the semiconductor layers and remote from the top and bottom surfaces; (c) selectively creating or interrupting a conductive channel in the control layer between a top conductive region, disposed below the top ohmic contact, and a tub conductive region, spaced apart from the top conductive region and extending at least to the blocking p-n junction, by applying a control potential to a gate contact disposed over the control layer so as to cause a least resistive path including the top conductive region, the conductive channel and the conductive tub region to be created between the top ohmic contact and the blocking p-n junction when the conductive channel is created.

In another preferred method, a method is provided for operating a semiconductor device having a plurality of semiconductor layers, a top and bottom surface and including a control layer defining the top layer of the device, the method comprising the steps of: (a) applying a voltage between a top and a bottom ohmic contact of the semiconductor device; (b) sustaining the voltage across a blocking p-n junction defined by the semiconductor layers and remote from the top and bottom surfaces; (c) selectively applying a control current to a latch-on gate contact disposed over a tub conductive region, the tub conductive region extending through an upper p-n junction defined by the semiconductor layers and remote from the top and bottom surfaces, the upper p-n junction being disposed above the blocking p-n junction and being selectively turned on when the control current is selectively applied to the latch-on gate; (d) selectively creating or interrupting a conductive channel in the control layer between a top conductive region, disposed below the top ohmic contact, and a tub conductive region, spaced apart from the top conductive region and extending through the upper p-n junction, by applying a control potential to a gate contact disposed over the control layer so as to selectively short-circuit the upper p-n junction when the conductive channel is created thereby turning off the thyristor semiconductor device.

BEST MODE OF CARRYING OUT THE INVENTION

Figure 1A:
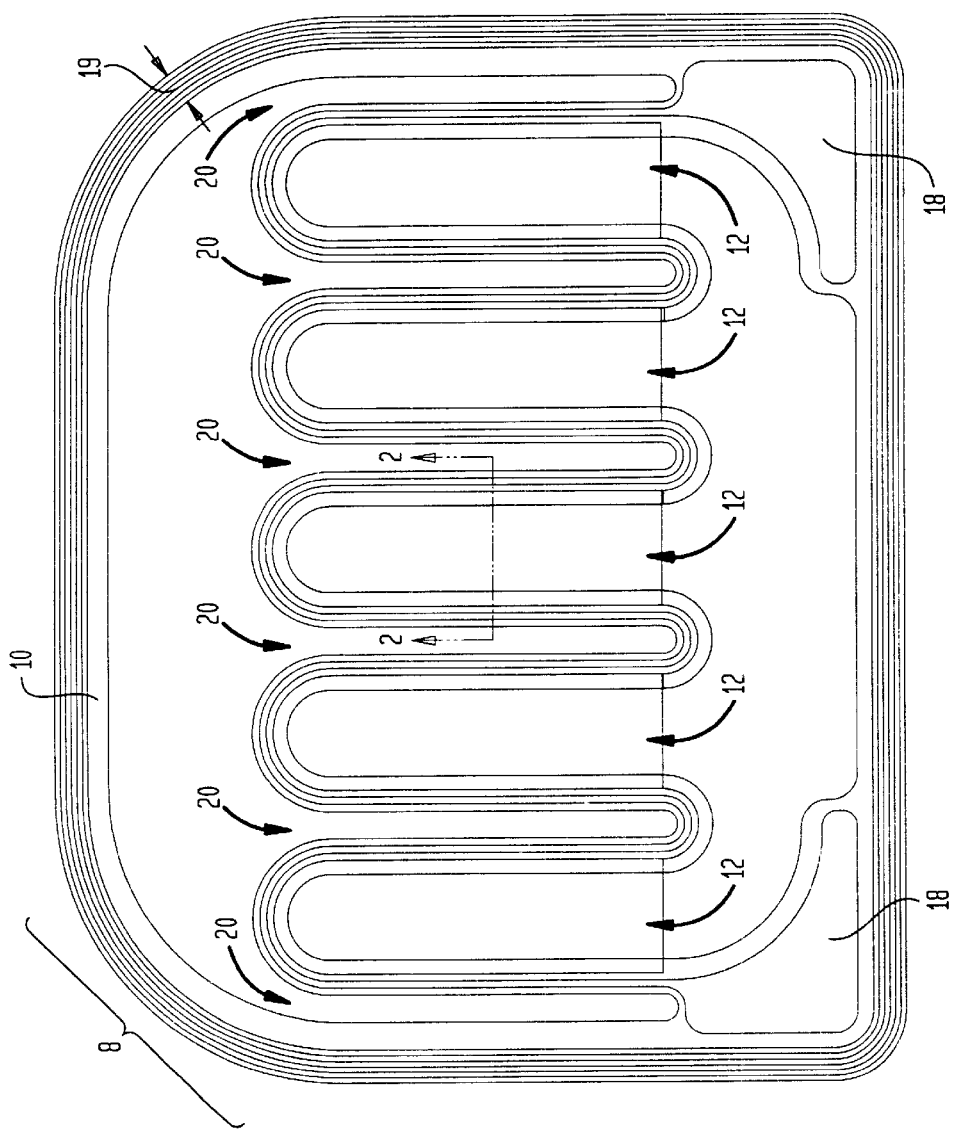
FIG. 1A is a plan view of the multilayer wafer of a full power semiconductor device embodying one form of the invention.
Figure 1B:
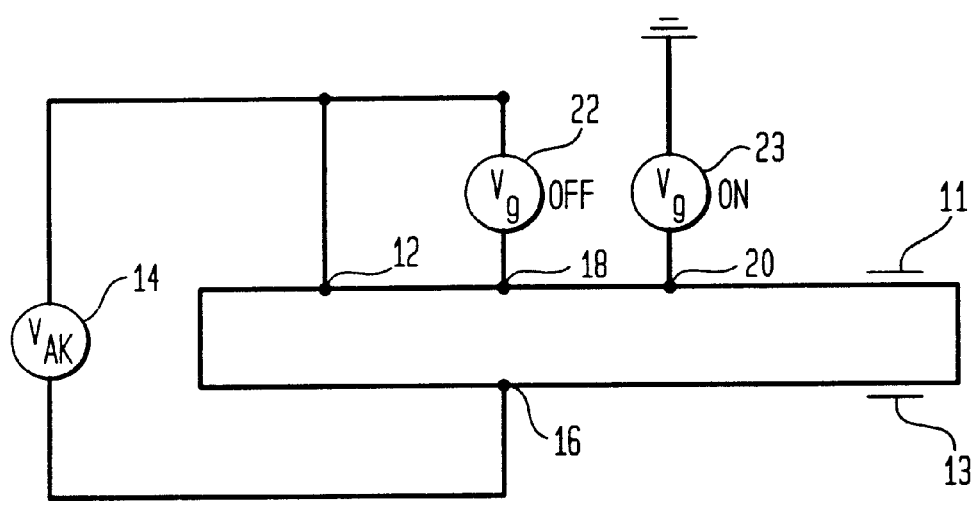
FIG. 1B is a side view of the wafer of FIG. 1A with applied control sources attached.

Referring to FIGS. 1A and 1B, in accordance with one embodiment of the invention a power semiconductor device 8 consists of a thin semiconductor wafer 10 comprised of multiple semiconductor layers extending through the wafer. Wafer 10 is bounded by top device surface 11 and bottom device surface 13. The device includes top ohmic contact 12 and bottom ohmic contact 16 for connection to external applied device voltage 14. Interdigitated gate contact 18, top ohmic contact 12 and thyristor turn-on gate contact 20 are formed on the top surface 11. Thyristor turn-on contact is only necessary for the thyristor type devices described below. External applied gate voltage is shown at 22 and external biasing current source at 23. Alternative geometries and layouts for the device contacts 12, 18 and 20 are also feasible. Wafer 10 is preferably made of SiC, although alternative semiconductor materials capable of both p-type and n-type doping, including but not limited to SiC, Si, Diamond, GaAs, GaN, AlN, AlGaN, InGaN, GaP, AlGaP or AlGaAsP, may be used. Peripheral edge termination rings 19, or other edge termination structures, may also be used.

Figure 2A:
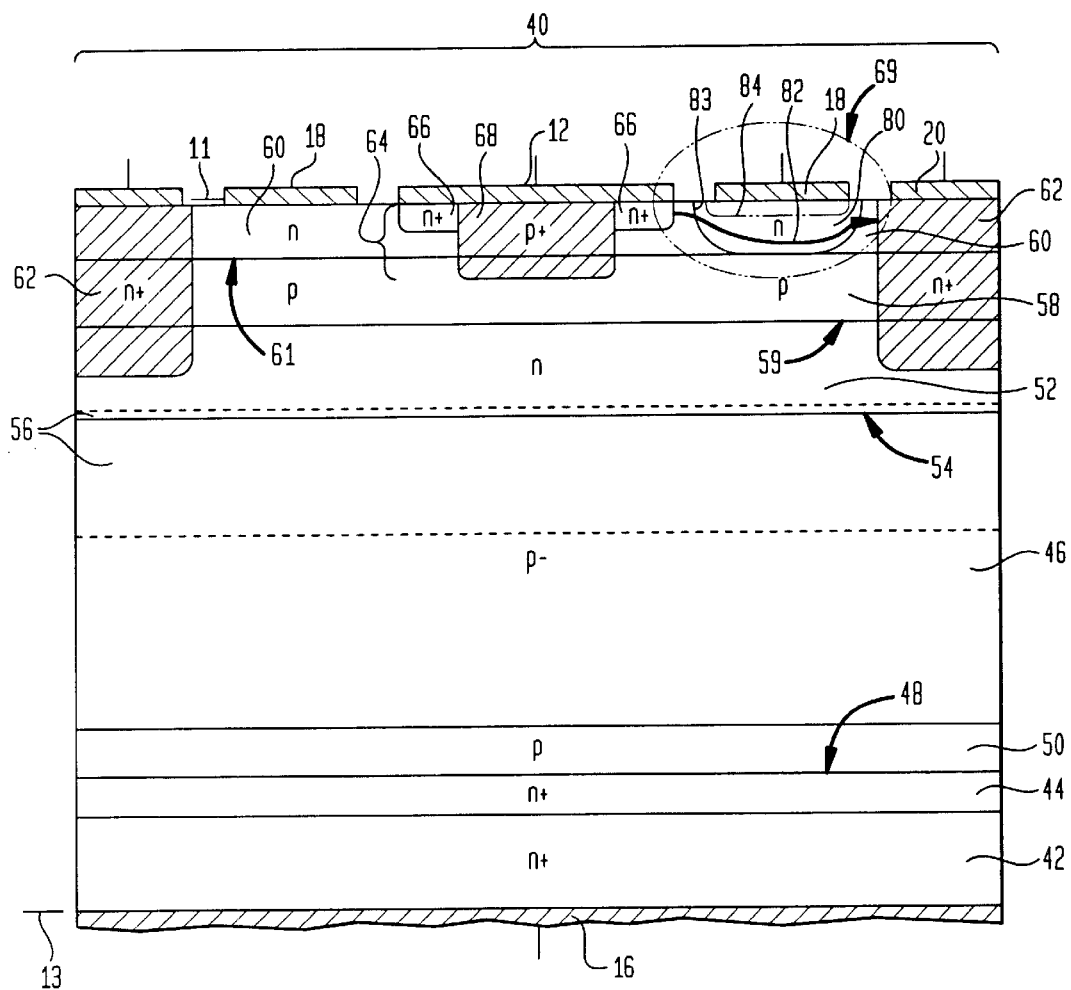
FIG. 2A is an enlarged sectional view of a single field turn-off thyristor cell along line 2—2 of FIG. 1.

FIG. 2A represents a single section or "cell" 40 of wafer 10 as seen through section 2—2 of FIG. 1A. In particular, cell 40 of FIG. 2 is a power thyristor made of SiC according to one preferred embodiment of the invention. It should be appreciated that wafer 10 includes numerous cells 40 of the type described. The semiconductor structure of FIG. 2A includes a bottom layer n+ substrate 42. The doping concentration of substrate 42 is typically $1 \times 10^{19}/cm^3$ or greater. Substrate 42 is also in contact with bottom ohmic contact 16 (thyristor cathode) at bottom device surface 13. An optional, relatively thin n+ buffer layer 44, of 0.5 gm for example, may be epitaxially grown on the upper surface of substrate 42 to improve the quality of subsequently grown semiconductor layers. Buffer layer 44 is typically used as a bed upon which subsequent semiconductor layers of high crystalline quality are epitaxially grown when substrate 42 is cut from a bulk source. Buffer layer 44 has a doping concentration similar to that of substrate 42.

P-blocking layer 46 is epitaxially grown on buffer layer 44 to form lower p-n junction 48. Blocking layer 46 is relatively thick and lightly doped as compared to substrate 42. Blocking layer 46 optionally includes p doped intermediate layer 50 adjacent to either substrate 42 or optional buffer layer 44. Intermediate layer 50 is epitaxially grown prior to blocking layer 46 and is more heavily doped than blocking layer 46. Intermediate layer 50 is typically included to create an asymmetric device having a more uniformly distributed electric field in blocking layer 46 under forward-biased applied device voltage 14. An n-type conduction layer 52 is epitaxially grown on blocking layer 46 to form blocking p-n junction 54. Conduction layer 52 is thinner and has a greater doping concentration than blocking layer 46. Depletion regions 56 are formed in conduction layer 52 and blocking layer 46. The higher doping concentration of conduction layer 52 vis-a-vis blocking layer 46 results in a significantly larger depletion region 56 within blocking layer 46 than in conduction layer 52.

P anode layer 58 is epitaxially grown on conduction layer 52 forming upper p-n junction 59. Anode layer 58 should have a thickness and doping level such that its intralayer conductivity, i.e. parallel to top and bottom surfaces 11 and 13 and parallel to upper p-n junction 59, is much lower than that of conduction layer 52. N-type control layer 60 is epitaxially grown on anode layer 58 forming control p-n junction 61. It should be appreciated that the doping concentration and thickness of control layer 60 are variable in determining both the maximum range of externally applied gate voltage 22 used to switch semiconductor device 8 off and the maximum current to be controlled through top contact 12. Further, the doping concentration and thickness of control layer 60 also determine the "normally-on" or "normally-off" status of the gate operation over the field effect region as described below. Other semiconductor growth methods may also be used to form any one or more of semiconductor layers described above.

N+ conductive tub region 62, and top conductive region 64, are created by ion implantation into control layer 60. More particularly, these regions are preferably created by triple ion implantation consisting of a first implantation to create n+ tub 62 a second implementation to create n+ first subregion 66, and a third implantation to create p+ second subregion 68. Alternatively, first subregion 66 and tub region 62 can be created during a single ion implantation step by using a sacrificial mask layer on top of first subregion 66. The n+ implantation can be performed using any n-type dopant although nitrogen is preferred. The p+ implantation can be performed using any p-type dopant, aluminum or boron for example, although a carbon/aluminum sequential, co-implantation employing approximately equal ion concentrations of carbon and aluminum is preferred. In a preferred implantation method, n-type nitrogen implantation is performed at a temperature greater than 600 degrees Celsius, and carbon/aluminum co-implantation is performed at room temperature. Photolithographic processes may be used to define the boundaries of the implanted regions. Post implantation annealing for all implanted regions, 62, 66 and 68 is performed at a common temperature of approximately 1200–1600 degrees Celsius for 10–60 minutes, although individual annealing of each implanted region may also be practiced.

On-gate contact 20 and top ohmic contact 12 are created after post implantation annealing by depositing an n-type ohmic contact refractory metal, alloy or high temperature silicide onto top surface 11 over n-type subregion 66 and tub region 62. Similarly, top ohmic contact 12 is created by depositing a p-type ohmic contact refractory metal, alloy or high temperature silicide onto device top surface 11 over p-type subregion 68. Preferred materials for the ohmic contact on the p-type regions include titanium, whereas preferred ohmic contact materials for the n-type regions include nickel. The ohmic contacts are then annealed at a temperature of 800 to 1300 degrees Celsius, although a preferred annealing occurs at a temperature of 900–1100 degrees Celsius for a duration of up to 60 minutes. Although not shown in FIG. 2A, additional standard semiconductor manufacturing practices may be used, including but not limited to the use of field oxide, passivation oxide, guard ring edge termination, field plates and p-n junction extensions.

Gate contacts 18 are created by one of a variety of methods depending on the type of gate structure desired. In the case of the Schottky gate contact 18 of FIG. 2A, gate metals that form high Schottky barrier heights, such as platinum, palladium and gold are preferred. A final gate metalization is used to deposit photolithographically defined gate contact 18. As further shown in FIG. 2B, a metal-semiconductor field effect transistor (MESFET) 69, having first subregion 66 of the top conductive region as the source and tub region 62 as the drain, results from the creation of a Schottky barrier gate over field effect region 80 of control layer 60.

Figure 2B:
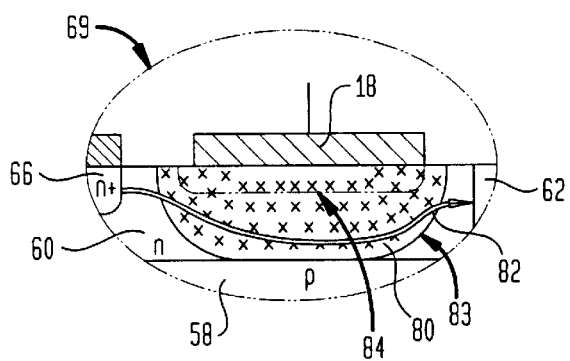
FIGS. 2B, 3B, 4B and 5B depict enlarged, more detailed views of portion of FIGS. 2A, 3A, 4A and 5A respectfully.

The field turn-off thyristor (FTO) of FIGS. 2A and 2B operates by applying external device voltage 14 between thyristor top ohmic (anode) contact 12 and thyristor bottom ohmic (cathode) contact 16. For the device shown in FIGS. 2A and 2B, the required external device voltage 14 results in anode 12 being positively with respect to cathode 16, and the thyristor is forward-biased. In this state, the upper and lower p-n junctions, 59 and 48 respectively, are also both forward-biased. Further, blocking junction 54 is reverse-biased in this configuration and sustains the applied external device voltage between the anode and cathode when the thyristor is in the "off" state. The differences in the relative doping concentration and thickness of blocking layer 46 as compared to heavier doped conductive layer 52 cause most of applied external device voltage 14 to be sustained across reverse-biased blocking junction 54. As with control layer 60, the doping concentrations and thicknesses of blocking layer 46 and conduction layer 52 should be controlled during device fabrication so as to accommodate the desired applied device voltages 14 to achieve proper thyristor operation. In particular, since blocking layer 46 is more lightly doped than conduction layer 52, depletion region 56 in blocking layer 46 is proportionately larger and extends farther into blocking layer 46 than into conduction layer 52, as shown in FIG. 2A.

In addition to external device voltage 14, the gate bias voltage 22 of FIG. 1B is applied between anode contact 12 and gate contact 18. Prior to thyristor turn-on, applied gate bias voltage 22 should cause field effect region 80 in control layer 60 of MESFET 69 to be devoid of carriers down to depletion boundary 83 which touches control p-n junction 61 (hereafter referred to as "pinched off"). "Pinch off" of field effect region 80 creates a high impedance path between first subregion 66 of top conductive region 64 and tub region 62. As mentioned above, the doping concentration and thickness of control layer 60 affect the gate bias voltage needed for "pinch-off". At a gate bias voltage 22 of 0V, for example, sufficiently thin and lightly doped control layer 60 will enable the more shallow built-in depletion boundary 84 to touch control junction 61 and "pinch off" field effect region 80, thereby creating a "normally-off" conduction channel in the FTO device. Alternatively, a thicker and more heavily doped control layer 60 will result in the need for a non-zero gate bias voltage 22 to be applied to gate 18 in order to "pinch-off" field effect region 80, thereby creating a "normally on" field-controlled, gate region.

An external, biasing current source (i.e. negative current) 23 is introduced at turn-on gate 20 to turn the thyristor on. Under the forward bias applied device voltage 14, electron injection from turn-on gate 20 through tub region 62 and into conduction layer 52 occurs, effectively turning on forward-biased, upper p-n junction 59. The turning on of upper p-n junction 59 leads to hole injection from anode region 68 and p anode layer 58. Since upper p-n junction 59 is forward-biased and the n-type conduction layer 52 is of higher conductivity than the p-type anode layer in a direction parallel to device surfaces 11 and 13, holes are injected across upper p-n junction 59 beneath p+ subregion 68 which results in the turn-on of the thyristor by the well-known regenerative process of hole injection from the anode and election injection from the cathode.

After the thyristor has become conducting, it can be turned-off by applying an external gate turn-off voltage 22 at gate contact 18. Assuming a normally off device within field effect region 80, MESFET 69 operates under gate turn-off voltage 22 to reduce the depletion region boundary 83 in field effect region 80 of control channel 60, thereby creating a low impedance conduction channel 82 coupling first subregion 66 of top conductive region 64 and tub region 62. At a threshold gate turn-off voltage, this low impedance conduction channel provides a lower resistive path for the anode current sufficient to shunt the current from anode contact 12 through subregion 66, conduction channel 82, conductive tub region 62 and into conduction layer 52. This shunting of current from the anode is such that the current necessary to support the well-known regenerative process of hole and electron injection is reduced below a threshold level. Therefore, the shunted current bypasses upper p-n junction 59, or alternatively, the upper p-n junction is shorted by the conduction of current through the tub, and thus turns thyristor 40 "off" by breaking the positive-feedback regenerative process of carrier injection within the thyristor.

Figure 3A:
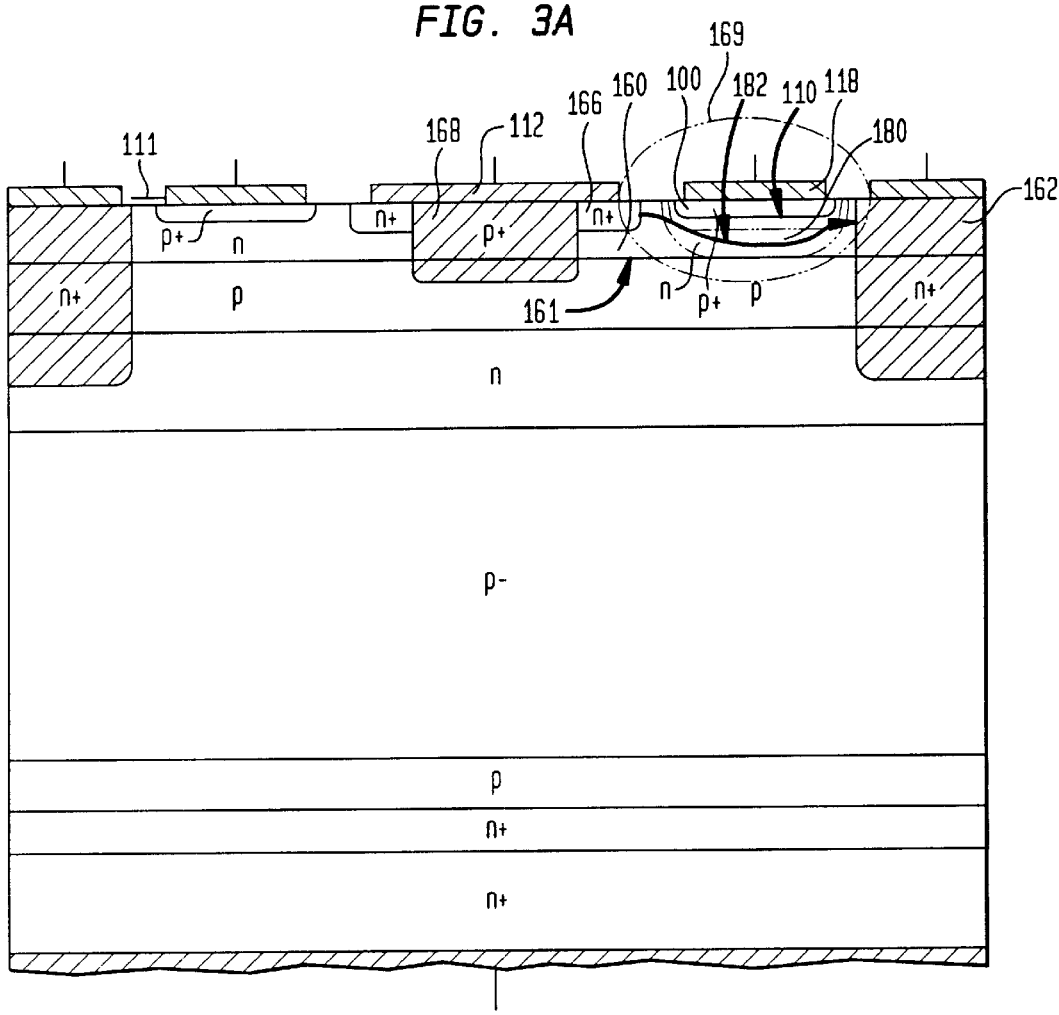
FIGS. 3A, 4A and 5A are enlarged sectional views of additional embodiments of the invention of FIG. 2A.
Figure 3B:
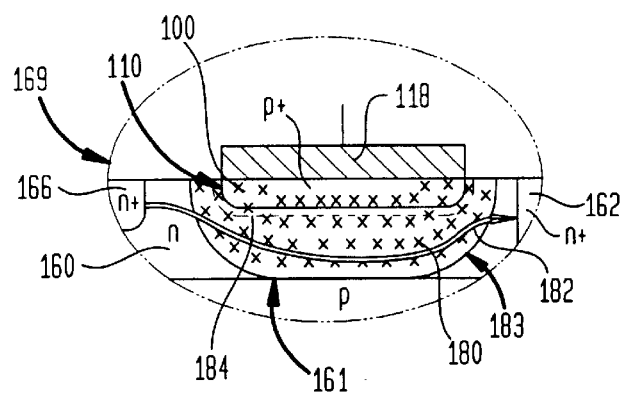
Figure 4A:
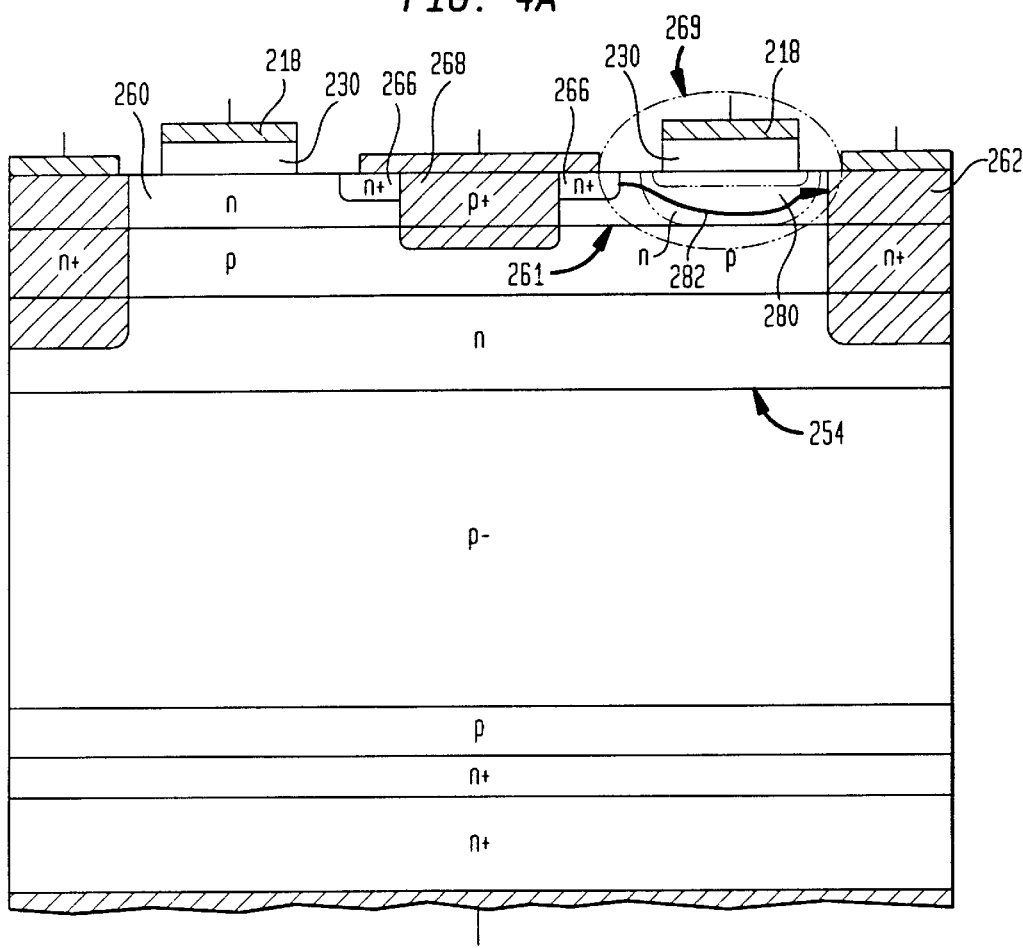

The thyristor devices of FIGS. 3A and 4A are fabricated and operated in a manner similar to the device of FIGS. 1 and 2, with the differences being in the fabrication and operation of the gate structure at gate contact 118. In the device of FIG. 3, a p+ ion implanted region 100 is created and extends into control layer 160 from top device surface 111 between first subregion 166 and tub region 162. P+ region 100 is implanted during a separate ion implantation process similar to that used to create the p+ subregion 168 of top conductive region. Alternatively, p+ region 100 and second subregion 168 can be created during a single ion implantation step by using a sacrificial mask layer on top of p+ region 100. P-type metal gate contact 118 overlies implanted region 100 and is created by depositing a p-type refractory metal, alloy or high temperature silicide onto device top surface 111. Metal gate contact 118 is desirably formed during the formation of anode contact 112 over p+ implanted subregion 168 and is annealed as discussed above.

In FIG. 3B, a junction field effect transistor (JFET) 169, having subregion 166 of top conductive region as a source and tub region 162 as a drain, results from the deposit of gate contact 118 over implanted region 100 within control layer 160. Prior to thyristor turn-on, an external applied gate voltage should cause field effect region 180 in control layer 160 of JFET 169 to be devoid of carriers down to depletion boundary 183 which touches control p-n junction 161 (i.e. "pinched-off"), effectively creating a high impedance path between first subregion 166 and tub region 162. The doping concentrations and thicknesses of control layer 160 and implant region 100 affect the gate bias voltage needed for "pinch-off". At a gate bias voltage of 0V, for example, sufficiently thin and lightly doped control layer 160 enables built-in depletion boundary 184 beneath junction 110 to "pinch-off" field effect region 180. During thyristor "turn-off", JFET 169 operates to reduce the depletion boundary 183 in field effect region 180 of control layer 160 as a result of an external gate turn-off voltage applied at gate contact 118, thereby creating a least resistive current shunting conduction channel 182 coupling first conductive subregion 166 and tub region 162 and effectively shorting the upper p-n junction.

Figure 4B:
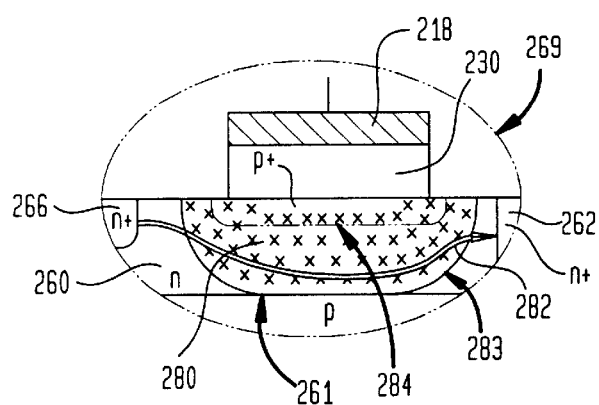

The alternative thyristor gate structures in FIGS. 4A and 4B are formed by growing and photolithographically defining gate insulator 230 over control layer 260 between first subregion 266 and tub region 262 following the post-implantation annealing of regions 266, 268, and 262. Although other insulators may be used, the preferred gate insulator is silicon dioxide and the preferred growth method is thermal oxidation performed at a temperature of 1100 to 1200 degrees Celsius. The duration of oxidation determines the final oxide thickness, preferably 400 to 2000 angstroms. For oxide insulators greater than 1000 angstroms, the preferred growth method is thermal growth of approximately 1000 angstroms of oxide followed by chemical vapor deposition of the remaining oxide. Gate contact 218 is deposited during either the p-type or n-type refractory metal deposition after the gate insulator has been defined. A preferred gate contact growth method is to deposit doped polysilicon on gate insulator 230 prior to depositing metal for gate contact 218. Annealing of all device contacts can be done as individual layers are deposited, although it is preferred that all contact annealing be done contemporaneously. All of the gate insulator 230 of FIGS. 4A and 4B is formed over epitaxially deposited control layer 260 and is not subject to the large electric fields within the thyristor, which are sustained at blocking junction 254, thereby providing a high-quality, reliable gate insulator with high channel mobility free from excessive electric field stresses.

In the device of FIG. 4B, a depletion-mode metal-oxide-semiconductor (depletion-mode MOSFET) 269, having first subregion 266 of top conductive region as a source and tub region 262 as a drain, results from gate contacts 218 and insulative layers 230 being deposited over control layer 260. Prior to thyristor turn-on, an external applied gate bias voltage should cause field effect region 280 in control layer 260 of MOSFET 269 to be devoid of carriers down to depletion boundary 283 which touches control junction 261 (i.e. "pinched-off"), thereby creating a high impedance path between first subregion 266 and tub region 262. The doping concentration of control layer 260, the thicknesses of control layer 260 and oxide layer 230, as well as the workfunction of gate metal 118 affect the gate bias voltage needed for "pinch-off". At a gate bias voltage of 0V, for example, sufficiently thin and lightly doped control layer 260 enables built-in depletion boundary 284 to "pinch-off" field effect region 280. In this case, the gate structure may actually be considered an enhancement-mode MOSFET. During thyristor "turn-off", MOSFET 269 operates to reduce the depletion boundary 283, in field effect region 280 of control layer 260 as a result of an external gate turn-off voltage applied at gate contact 218, thereby creating a current shunting, low impedance conduction channel 282 coupling first subregion 266 and tub region 262. Similar semiconductor design considerations for the control channel MESFET and JFET of FIGS. 2 and 3 may also be applied in creating a "normally-on" or a "normally-off" conduction channel base upon the doping concentration and thickness of control layer.

Figure 5A:
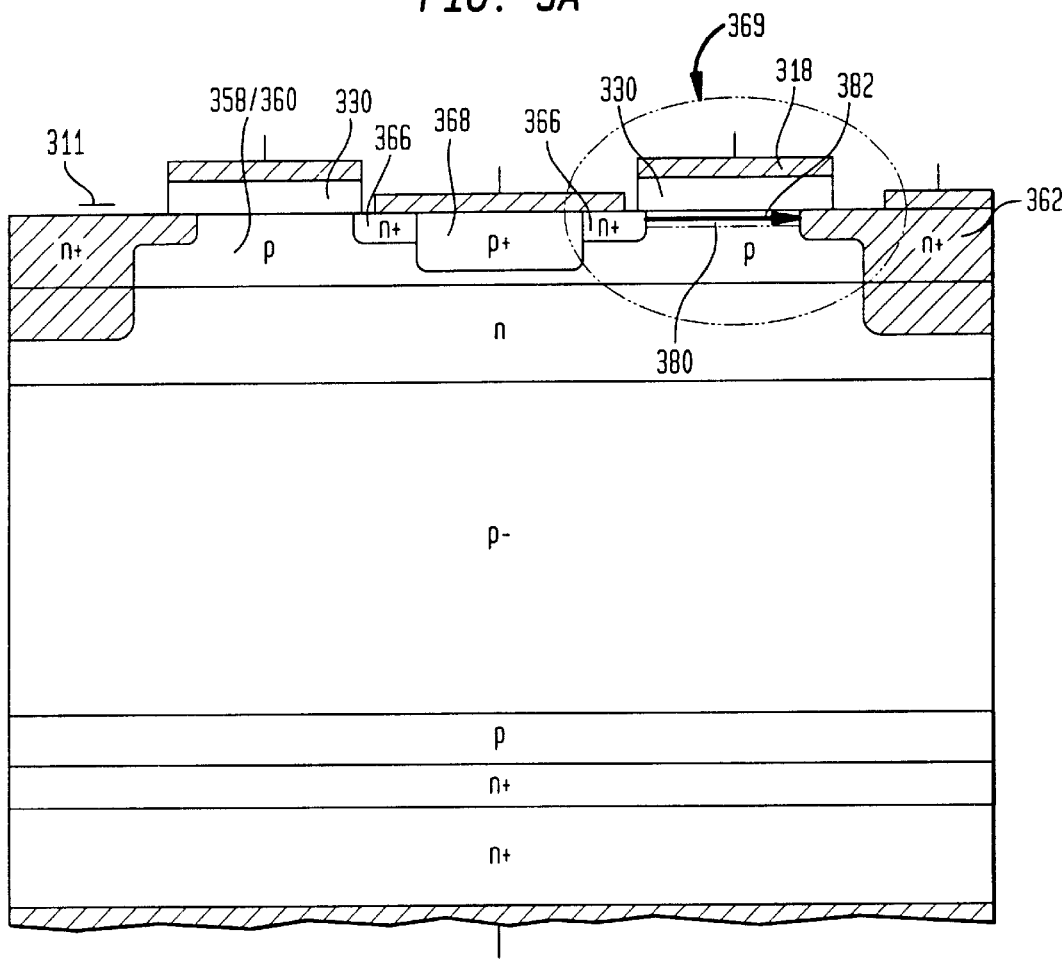
Figure 5B:
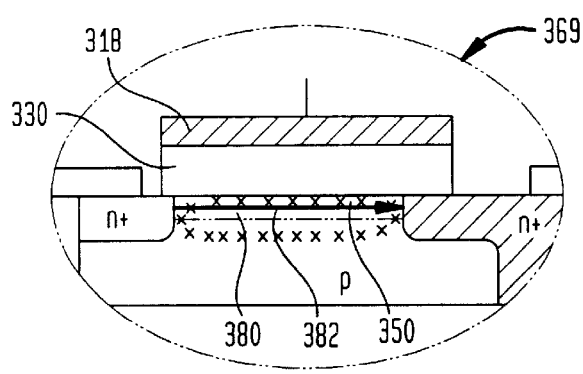

The device of FIGS. 5A and 5B omits the topmost n-type semiconductor layer used in FIG. 4A. Thus, the p-type anode layer 358 also functions as control layer 360 and defines the thyristor top surface 311. An enhancement-mode metal-oxide-semiconductor (enhancement-mode MOSFET) 369, having first subregion 366 as a source and tub region 362 as a drain, results from gate contacts 318 and insulative layers 330 being deposited over control layer 360 and partially over first subregion 366 and tub region 362. Prior to thyristor turn-on, the absence of an external applied gate voltage prohibits the creation of an enhanced carrier region 350 between subregion 366 and tub region 362, thereby maintaining a high impedance path between first subregion 366 and tub region 362. During thyristor "turn-off", MOSFET 369 operates under an external applied gate voltage to create conductive inversion channel 350 beneath insulative layer 330 and within field effect region 380 of control layer 360, thereby creating a current shunting, low impedance conduction channel 382 coupling first subregion 366 and tub region 362. A "normally-on" gate structure may also be operated with the structure of FIG. 5B by using an appropriate doping concentration for layer 360, thickness of insulative layer 330 and workfunction for the gate metal contact 318 such that the threshold gate voltage of MOSFET 369 becomes negative, essentially resulting in a depletion-mode device.

Referring now to FIGS. 6–9, high-power, field-controlled transistors (FCTs) are disclosed having similar fabrication steps and identical gate variations as the FTOs of FIGS. 2–5. Fabrication of FCT semiconductor layers is accomplished in the same manner as for corresponding layers of the FTOs, with the following differences. First, since only one device p-n junction is needed, an n-blocking layer 446 of FIG. 6A is epitaxially grown on buffer layer 444 without an overlying separate epitaxial conduction layer. Second, no optional intermediate layer is present since buffer layer 444 and substrate 442 are of the same conductivity type as the n-blocking layer 446. Third, no on-gate contact is needed since the gate structure performs both the FCT turn-on and turn-off functions.

Figure 6A:
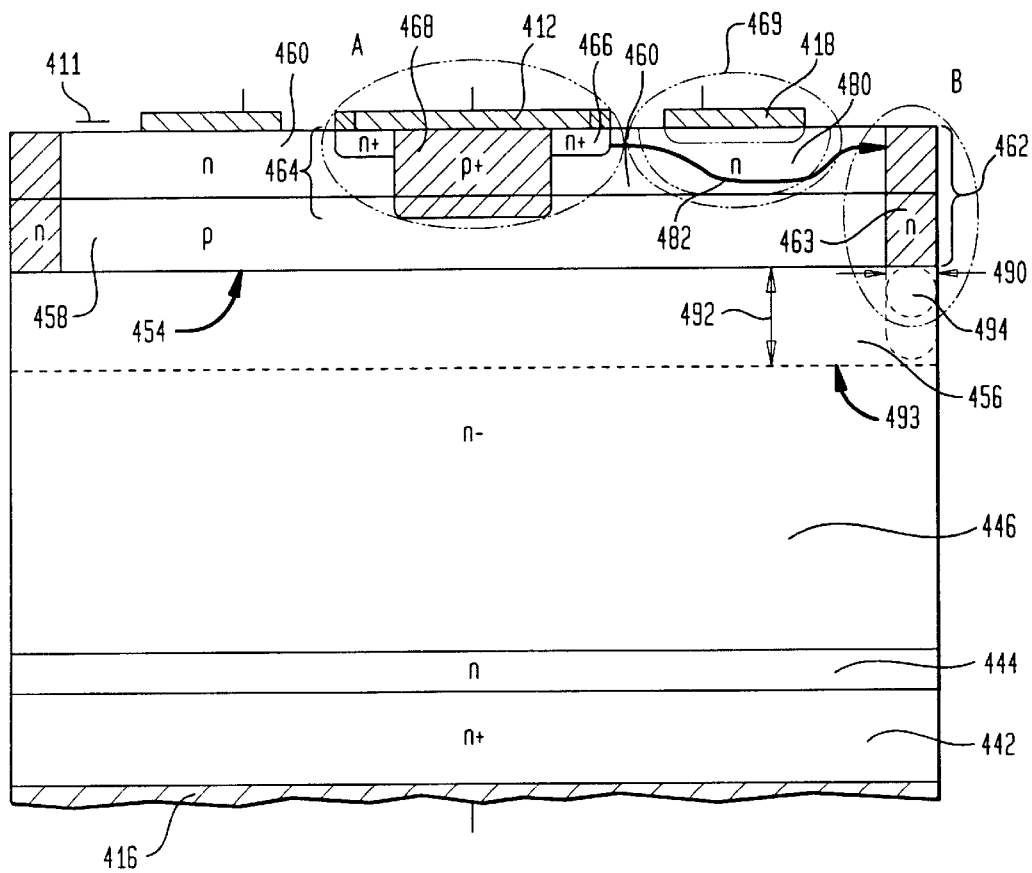
FIGS. 6A, 7, 8 and 9 are enlarged sectional views of field-controlled transistors according to further embodiments of the invention.
Figure 6B:
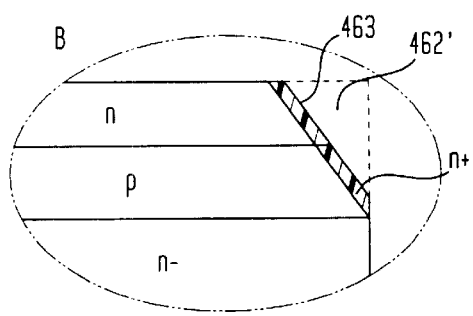
FIGS. 6B and 6C depict enlarged, more detailed views of alternative embodiment of portions of FIG. 6A, 7, 8, 10, 11 and 12 according to the present invention.

One additional FCT design consideration, not present in the FTOs, is depicted in FIG. 6A. In particular, rectangular tub region 462 should extend from device surface 411 at least to blocking junction 454, and optionally only slightly beyond. Further, at low external applied device voltages, high impedance, field effect region 480 sustains the device voltage. To ensure both proper device operation and proper sustenance of the device voltage as the device voltage increases, tub region 462 should preferably have a width 490 less than one-half the depletion depth 492 of depletion region 456 in n-thick blocking layer 446. This limitation should be satisfied at all applied device voltages up to and including the maximum voltage that can be sustained by field effect region 480 between subregion 468 and tub region 462. This ensures that the depletion edges 493 of adjacent device cells reach each other in volume 494, beneath the tub region 462, thereby effectively shielding tub region 462 and field effect region 480 from further increases in external applied voltage and ensuring that any increased device voltage is dropped across blocking junction 454. Tub width 490 should typically be less than or about one micrometer (1 $\mu$m). An alternative embodiment of tub region 462, further achieving the shielding benefits described above, includes a triangular etched tub 462' as shown in FIG. 6B. Triangular tub 462' is preferably dry etched using $SiO_2$ or other insulator as an etching mask to remove a triangular portion of control layer 460 and p source layer 458. Ion implantation, preferably using nitrogen, is then performed, forming a shallow n-type region 463.

In addition to the depletion region 492 created in n-blocking layer 446, the physical size and doping of tub region 462 is preferably such that p source layer 458 depletes tub region 462 of carriers in the horizontal region 463 adjacent to the p source layer. This depletion area further ensures that a high resistance path exists between the top ohmic (source) contact 412 and bottom contact (drain) 416 as viewed along the path including: the first subregion 466, conductive channel 482 (which may be "normally on" or "normally off" as described above), conductive tub region 472 and blocking layer region 494 directly beneath conductive tub region 472.

Field-controlled transistor of FIG. 6A is operated by applying an external device voltage between top ohmic contact (transistor source) 412 and bottom ohmic contact (transistor drain) 416 and an external gate bias voltage at gate contact 418.

Prior to FCT turn-on, the applied gate bias voltage at gate contact 418 causes field effect region 480 in control layer 460 of MESFET 469 to be "pinched off," as previously described for a normally-off device. The external device voltage should be of proper magnitude to operate the transistor without exceeding the transistor breakdown voltage. As with the FTOs of FIGS. 2–5, most of the applied device voltage is sustained across reverse-biased blocking junction 454 once the depletion region 456 in volume 494 beneath tub 462 is large enough to shield tub region 462 and field effect region 480 as described above. As with control layer 460, the doping concentrations and thicknesses of blocking layer 446 and source layer 458 affect the maximum sustainable applied device voltage and should be fabricated to achieve proper transistor operation.

To turn on the FCT of FIG. 6A, an appropriate potential is applied to MESFET 469 at gate contact 418. In response to the applied gate potential, the conductive tub region 463 becomes undepleted. More specifically, this applied potential creates conduction channel 482 which electrically connects first subregion 466 and tub region 462 as previously described. Electrons from subregion 466 flow along conduction channel 482 to tub region 462 and into drain region 416. The tub region 463 is flooded with electrons and becomes undepleted. As the current through tub 462 increases, a conical current spreading takes place beneath tub 462 whereby the injected current through tub 462 spreads laterally, thereby increasing the current density within the depletion region in blocking layer 446 in the region laterally adjacent to conductive tubs 462. As the current density increases, the reverse bias voltage across blocking p-n junction 454 decreases resulting in the turn-on of the field-controlled transistor.

The FCT of FIG. 6A can be turned off by applying an appropriate external gate voltage at gate contact 418 of MESFET 469 to cause field effect region 480 to be completely "pinched-off" as described above. In response to the selectively applied gate voltage, the tub region 463 becomes depleted. More specifically, removal of conduction channel 482 prevents the transport of electrons through tub region 462 and permits the depletion layer 458 within blocking layer 446 to be reestablished. The device of FIG. 6A is known as a unipolar device since only one carrier type, i.e. electrons, are involved in the operation of the device.

The operative mechanisms employed by the different gate structures 469, 479 489 and 499 of FIGS. 6–9 are identical to those of the FTO devices of FIGS. 2–5 given the differences in the above-described, overall device operation for the FCT. Gate structure 469 of FIG. 6A comprises a Schottky gate (MESFET). Gate structure 479 of FIG. 7 comprises a p-n junction gate (JFET). Gate structures 489 and 499 of FIGS. 7 and 8 comprise depletion-mode and enhancement-mode NMOS gates (DMOSFET and EMOSFET). The alternative embodiment of FIG. 6B may also be used for the tub regions of FIGS. 7–9.

Figure 6C:
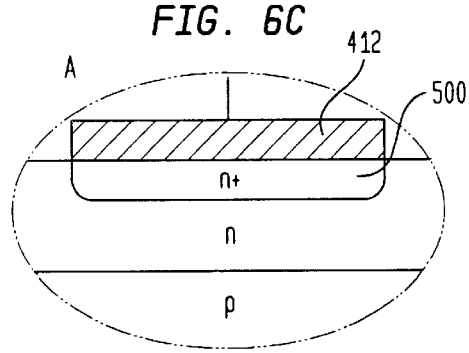
Figure 7:
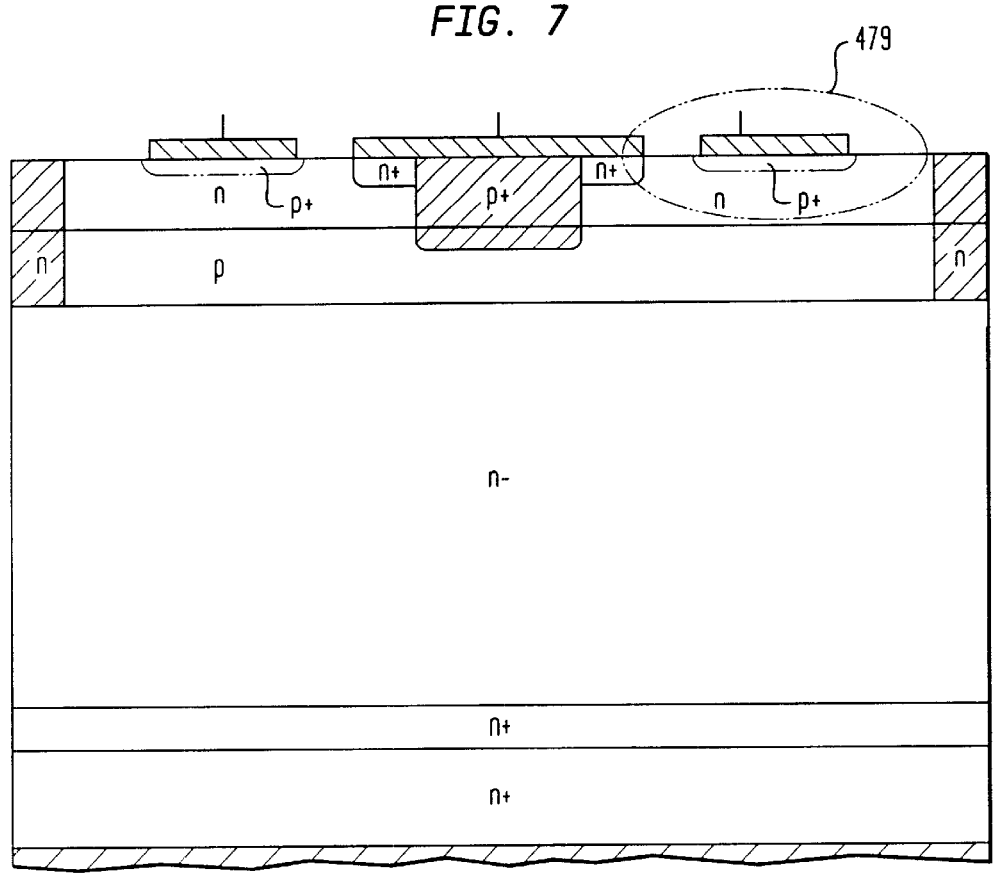
Figure 8:
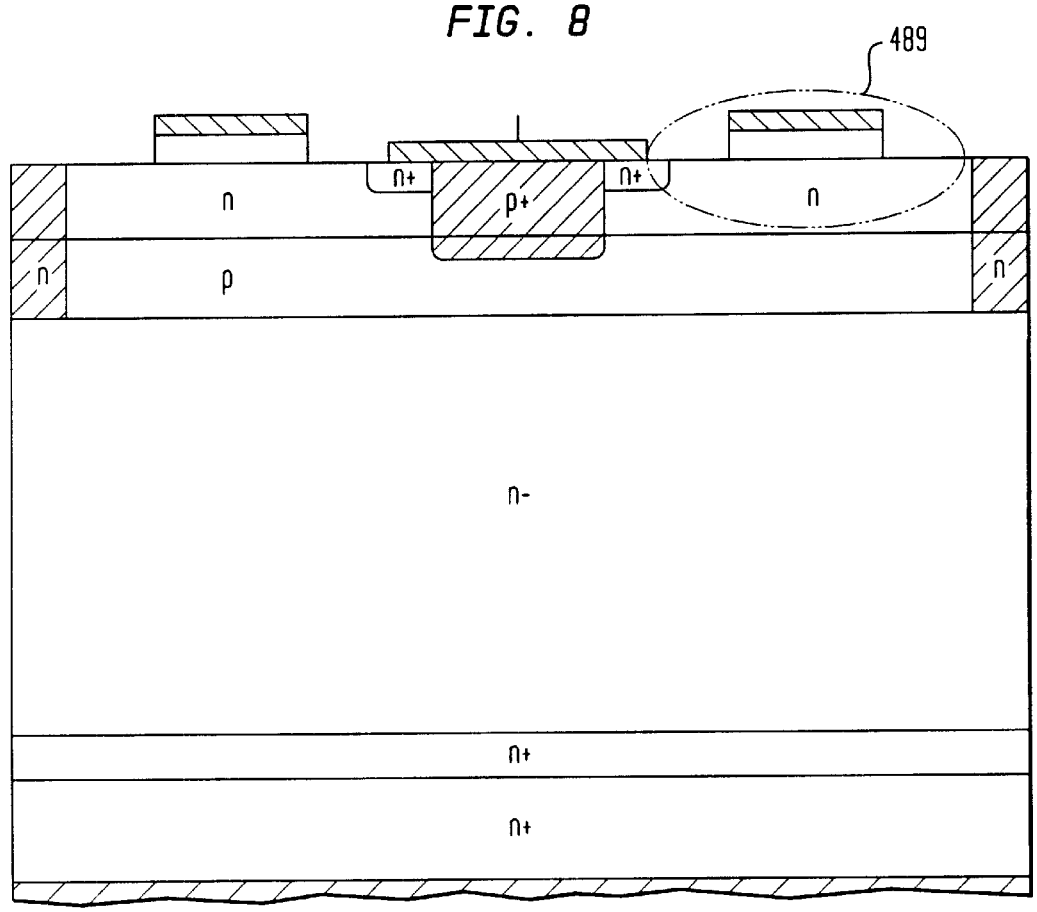
Figure 9:
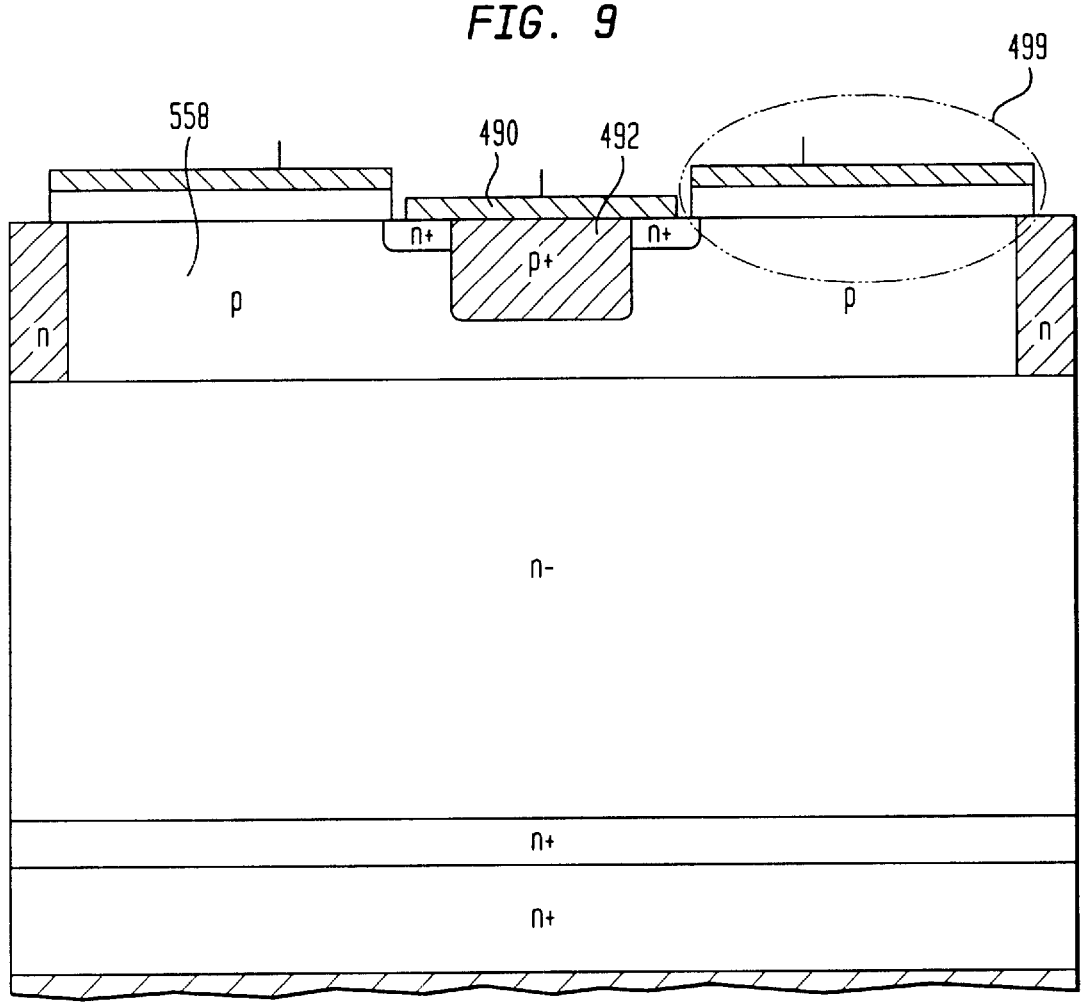

FIG. 6C represents an alternative embodiment of top conductive region 464 beneath top ohmic contact 412 in FIG. 6A. An n+ implantation is used to create top conductive region 500 without a p+ subregion. Full electrical contact of top ohmic contact 412 with the ion implanted n+ region 500 forms the source of the FCT. The alternative embodiment of FIG. 6C can be properly employed in the devices of FIGS. 6A, 7 and 8. The alternative embodiment of FIG. 6C should not be used with the semiconductor device of FIG. 9, since p+ subregion 492 must be present to electrically connect top ohmic contact 490 to control layer 558 and eliminate any MOSFET body bias effect due to the floating voltage of control layer 558.

Referring now to FIGS. 10–13, high-power, field-gated bipolar transistors (FGBTs) are disclosed having similar fabrication steps and identical gate variations as the FCTs of FIGS. 6–9. In general, the FGBT of FIG. 10 consists of two p-n junctions, lower p-n junction 648 and blocking p-n junction 654, with device turn-on and turn-off effected through a single gate contact 618. Fabrication of FGBT semiconductor layers is accomplished in the same manner as for corresponding layers of the FCTs, with the following difference. Device fabrication begins with a p+ substrate 642 followed by epitaxial growth of p+ buffer layer 644. Optional intermediate layer 650 is included if an asymmetrical device is desired. In all other relevant respects, the fabrication of the FGBTs of FIGS. 10–13 are identical to the corresponding FCTs of FIGS. 6–9.

The operation of the FGBTs of FIGS. 10–13 is similar to that of the FCTs of FIGS. 6–9. More specifically, in response to the selectively applied gate voltage to the field effect region, the tub region becomes depleted and undepleted in response to the gate voltage, causing the FGBTs of FIGS. 10–13 to turn off and on, respectively.

Figure 10:
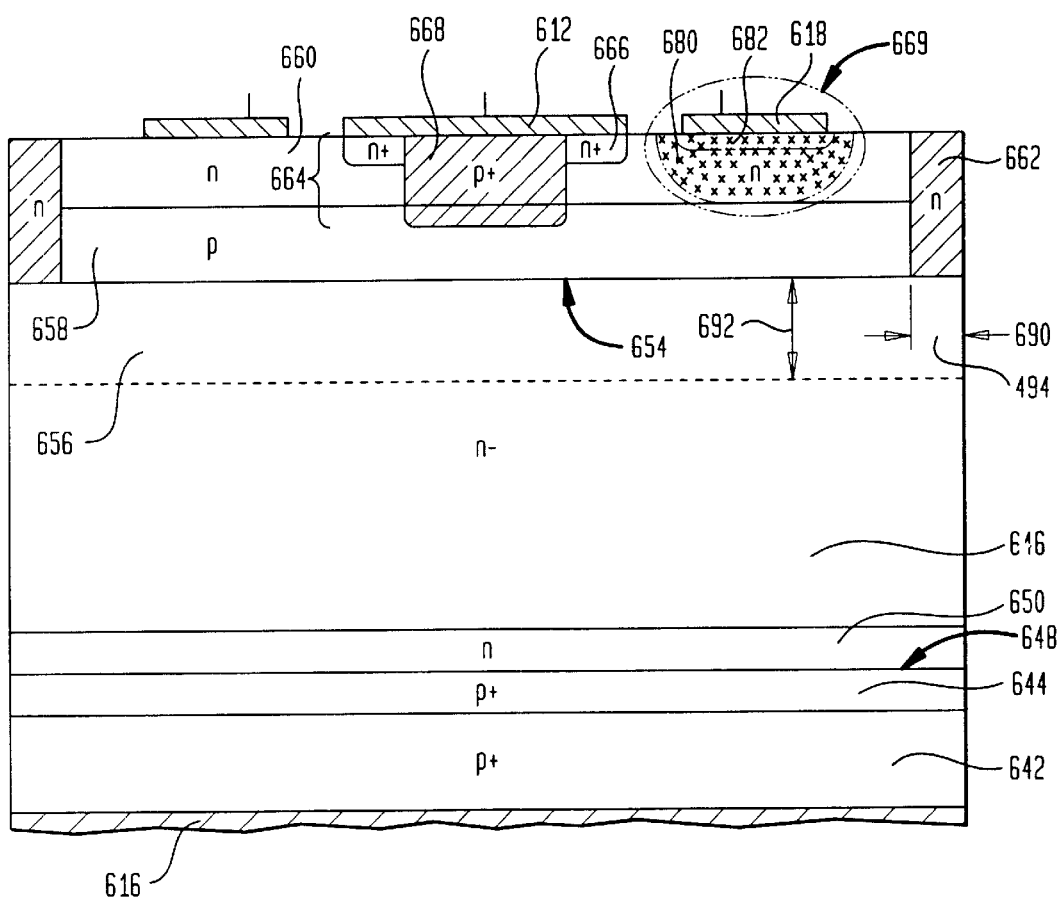
FIGS. 10–13 are enlarged sectional views of field-gated bipolar transistor cells according to further embodiments of the invention.
Figure 11:
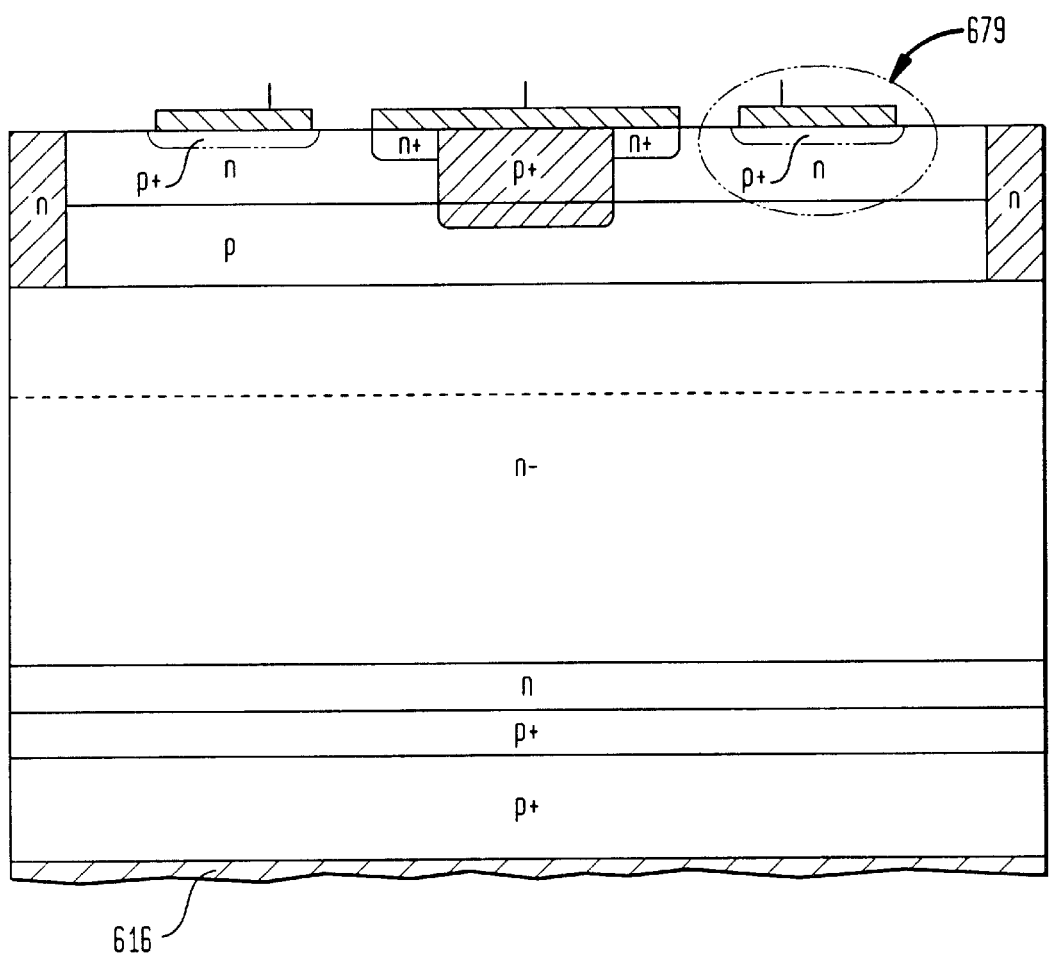
Figure 12:
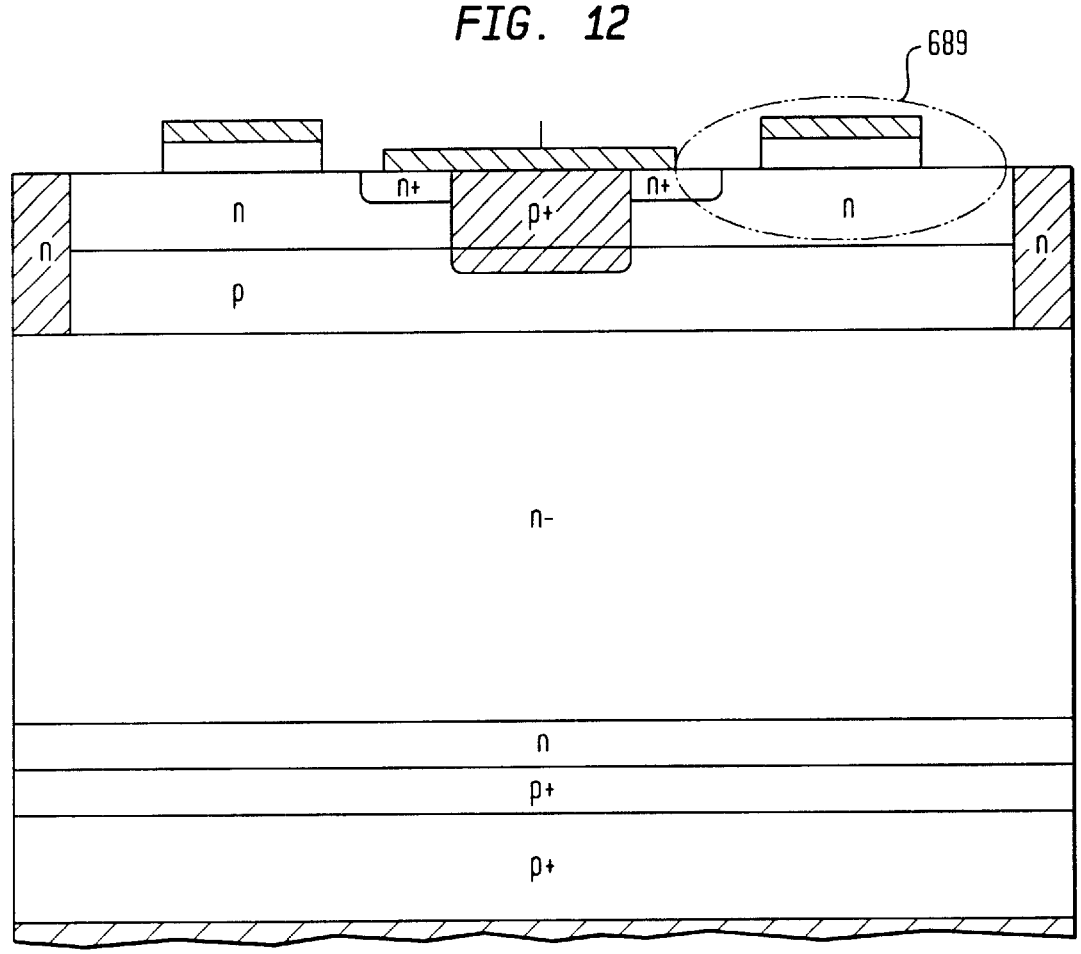
Figure 13:
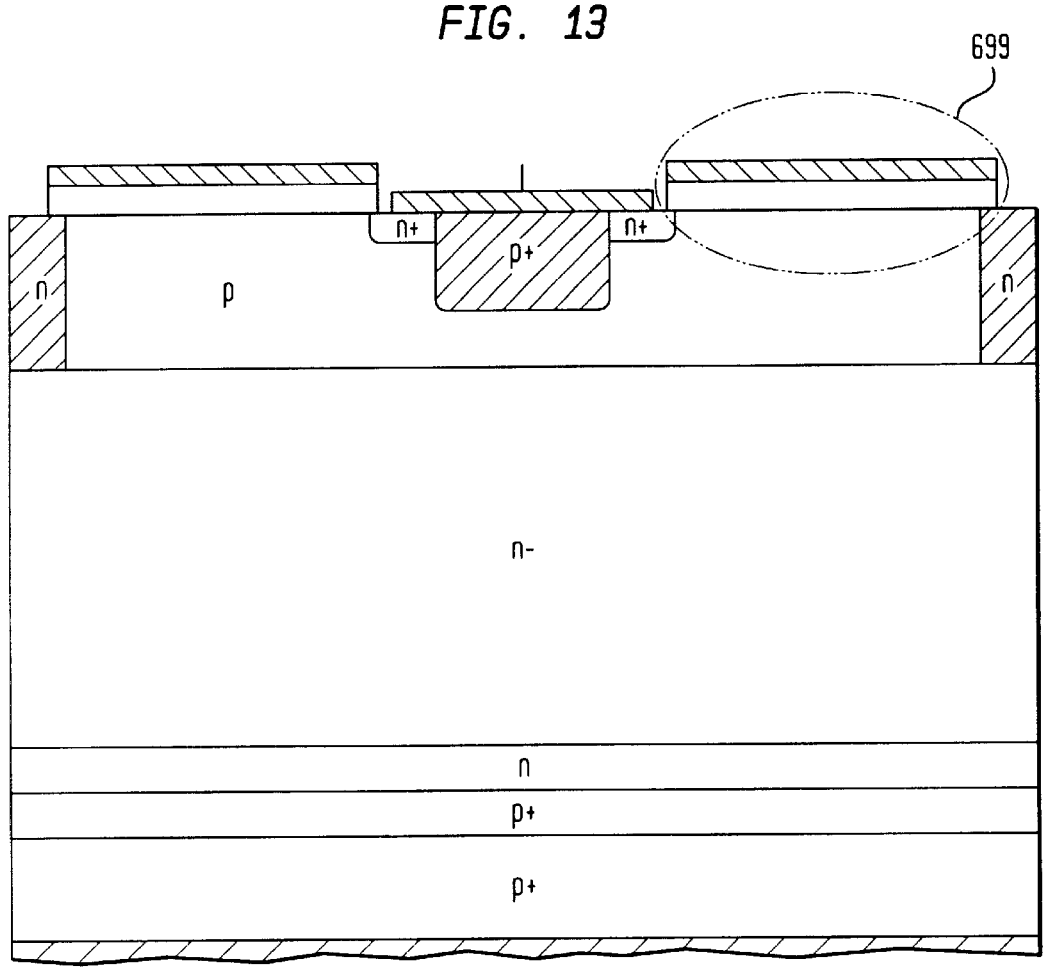

FIG. 6B represents an alternative embodiment of the tub regions of FIGS. 10–13, and FIG. 6C represents an alternative embodiment of the top conductive region of FIGS. 10, 11 and 12 for the same reasons described above.

Figure 14A:
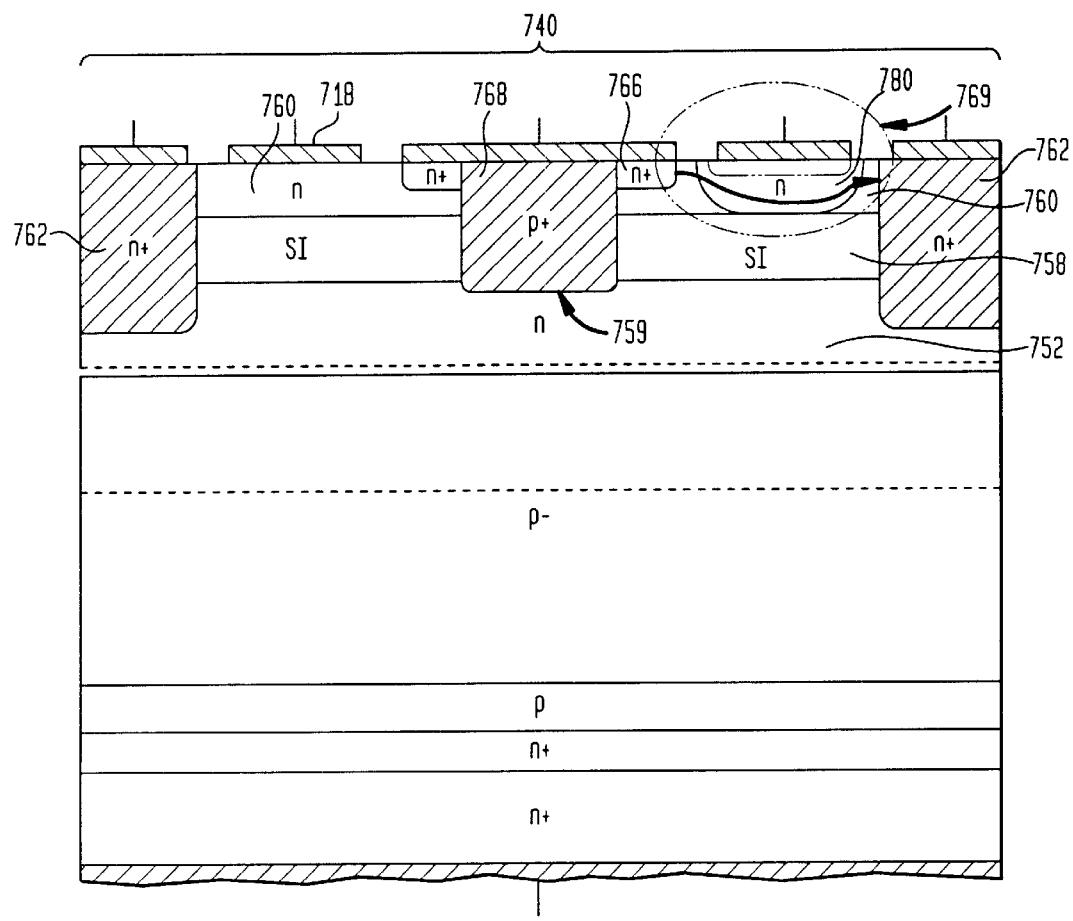
FIGS. 14A and 15A are further embodiments of an enlarged sectional view of a single field turn-off thyristor cell along line 2—2 of FIG. 1.

In another embodiment of the FTO thyristor as shown in FIG. 14A, the anode layer is replaced with a semi-insulating (SI) region 758 at least on both sides of the p+ sub region 768. In a preferred fabrication method, region 758 is converted from an n-type semiconductor into a semi-insulating layer through ion implantation, for example by ion implanting vanadium in the case of SiC devices. P+ sub region 768 is formed by ion implantation using Al or B or co-implantation of C with either Al or B. P+ sub region 768 extends through the n-type control layer 760 and at least to the n-layer 752. The remaining arrangement of the structure and operation of device 740 is identical to that of the FTO thyristor shown in FIG. 2A. Since the p-type anode layer is replaced with semi-insulating layer 758, upper p-n junction 759 is restricted to the region beneath p+ subregion 768, and the control p-n junction beneath the n-type control layer 760 is eliminated.

The inclusion of semi-insulating region 758 in FIG. 14A is used to prevent parasitic currents which otherwise exist in device 40 of FIG. 2A. In FIG. 2A, gate 18, forming a Schottky contact with control layer 60 of MESFET 69, along with underlying n-type control layer 60 and p-type anode layer 58 effectively act like a "p"-n-p transistor, where "p" denotes a Schottky contact metal. When FTO thyristor 40 is operating and MESFET 69 is pinched off to prevent the conduction of currents through the control channel, this "p"-n-p transistor effectively has an n-type base region that is depleted of carriers, i.e. "punched through." This occurs when Schottky gate 18 is biased to deplete carriers from control layer 60, thereby providing a high impedance region in field effect region 80, effectively turning off conduction channel 82. In this pinched off condition, the depletion boundary 83 extends to touch p-type anode layer 58 and the "p" region of gate 18 and the p-type layer 58 are effectively shorted. In this punch through condition, a large, undesirable parasitic current will be drawn from the gate biasing element 22 of FIG. 1B via gate 18, through the pinched off region and into p-type anode layer 58 to maintain the depleted channel condition. This parasitic current not only increases the demand on the gating circuitry, but may also cause faulty turn-on of the FTO thyristor. With the use of semi-insulating layer 758 shown in FIG. 14A, this punch-through problem is eliminated because semi-insulating region 758 effectively isolates control channel 760 and field effect region 780 by limiting any significant parasitic current conduction in a direction perpendicular to the top device surface and downwards from Schottky gate 718. The semi-insulating layer 858 of the device of FIG. 15, employing a JFET channel region, operates in the same manner with the Schottky gate region being replaced in function by the p+ ion implanted region 860.

Figure 14B:
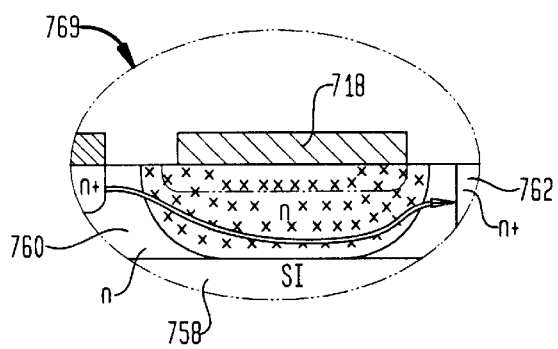
FIGS. 14B and 15B depict enlarged, more detailed views of portion of FIGS. 14A and 15A respectfully.

The details of metal semiconductor field effect transistor (MESFET) 769 are illustrated in FIG. 14B. Specifically, the voltage applied to the gate 718 should be such that the MESFET channel is created and conducting current only when the FTO thyristor of FIG. 14A is to be turned off. When MESFET 769 is designed to be a normally-off device, a forward voltage pulse is applied to gate 718 only during FTO thyristor turn-off to bypass the anode current through MESFET 769. Alternatively, MESFET 769 may also be designed to be a normally-on device, i.e. a conducting channel exists under gate 718 even before any external gate voltage is applied. In the case of a normally-on MESFET 769, a reverse gate voltage is needed to interrupt the channel of MESFET 769 and to turn on FTO thyristor 740 and maintain it in the "on" state. In either case, the FTO thyristor 740 is turned off by applying the necessary potential to gate 718 to open up the channel of MESFET 769 so as to bypass anode current and turn off FTO thyristor 740.

Figure 15A:
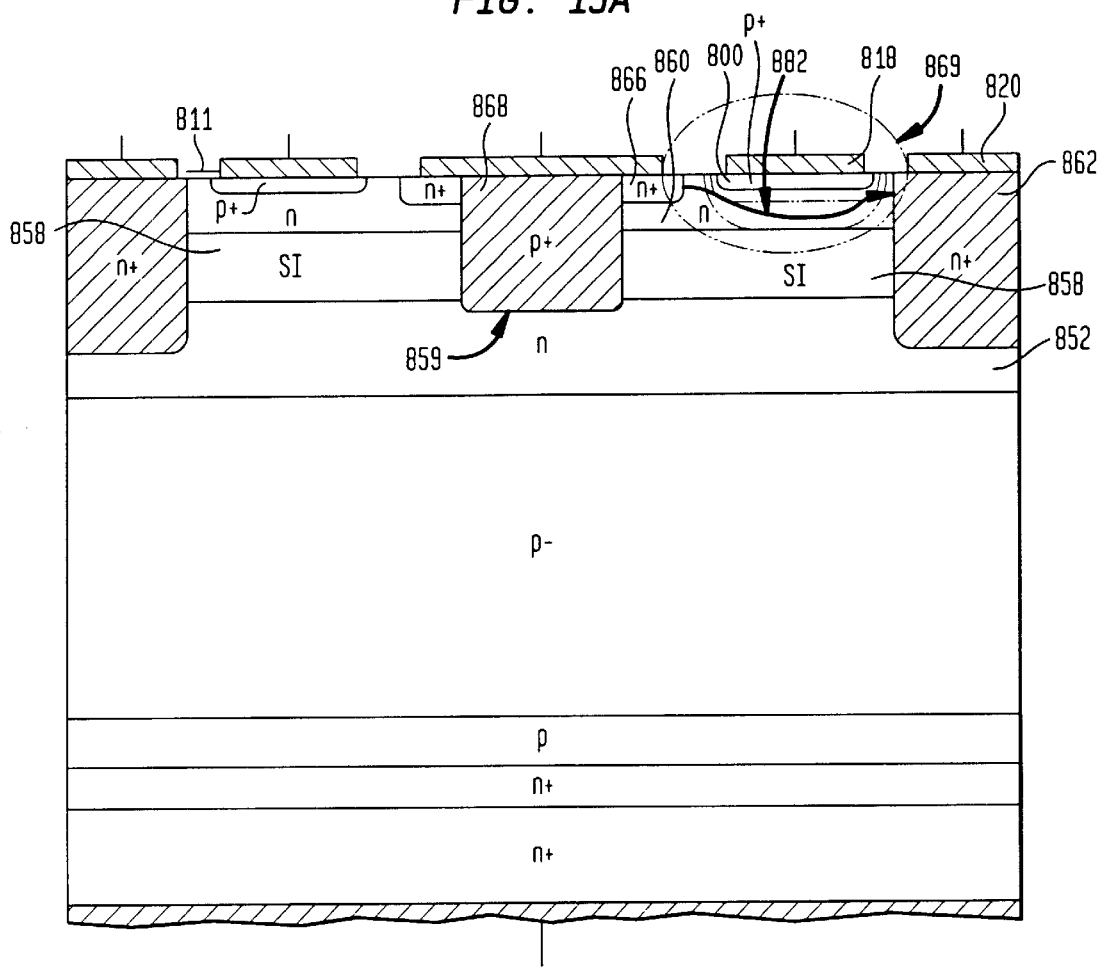

The FTO thyristor of FIG. 15A is fabricated and operated in a manner similar to the device of FIG. 14A, with the differences being in the fabrication and operation of the gate contact 818. In the device of FIG. 15A, a p+ ion implanted region 800 is created and extends into the control layer 860 from top device surface 811 between first subregion 866 and tub region 862. Further, the metal contact between gate contact 818 and p+ region 800 is an ohmic contact whereas the contact in FIG. 14A between gate contact 718 and the n-type layer 760 is a Schottky barrier contact. As with the FTO device of FIG. 3B, the p+ region 800, n+ sub region 866, n+ tub region 862, and conduction channel 882 form a junction field effect transistor (JFET) 869. Just as MESFET 769 of FIG. 14B, can be either normally-off or normally-on, JFET 869 can also be either normally-off or normally-on. As with the device of FIG. 14, the replacement of the p-type anode layer with semi-insulating layer 858 results in the upper p-n junction 859 being restricted to the region beneath p-type subregion 868 and the control p-n junction beneath n-type control layer 860 is eliminated.

Figure 15B:
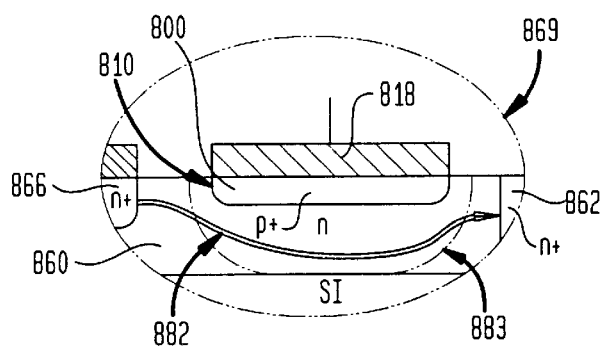

JFET 869 of FIG. 15B operates in the same manner as JFET 169 of FIG. 3B. FIG. 15B shows the detail of JFET 869 which is constructed and operated identically to JFET 169 of FIG. 3B. In particular, for a normally-on JFET, a reverse bias voltage applied to the gate contact 818 causes the depletion boundary 883 to extend towards semi-insulating region 858 and turns off JFET 869 through pinch off. This, in turn, allows the turn-on of the FTO thyristor through p+ subregion 868 and n-type conduction layer 852, essentially a p-n diode, by applying a turn-on current to the on-gate contact 820. Semi-insulating region 858 serves the same purposes in reducing parasitic currents as discussed with respect to semi-insulating region 758 of FIG. 14A above. For a normally-off JFET, no gate bias is needed as the pinch-off condition is present without a gate bias voltage. In comparison to MESFET 769 of FIG. 14B, JFET 869 enables the device of FIG. 15 to operate at higher temperatures because of the well-known, superior temperature tolerance of JFETs in comparison to MESFETs. When implemented using SiC semiconductor, the device of FIG. 15A can be operated at ambient temperatures of greater than 500 degrees Celsius. Further, the device of FIG. 15A has a higher reliability than a similarly fabricated metal-oxide-field-effect transistor (MOSFET) since oxides and other insulator gate dielectrics are known to degrade semiconductor device reliability at high temperatures.

Figure 16A:
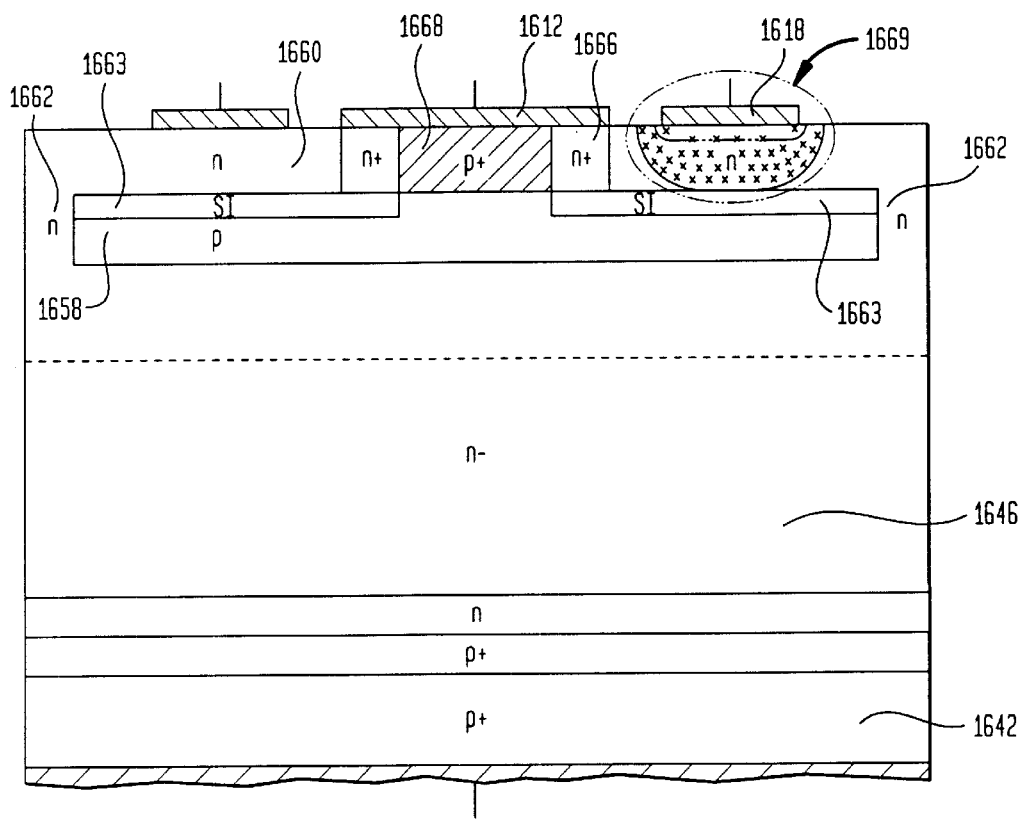
FIGS. 16 and 17 are enlarged sectional views of field-gated bipolar transistors according to further embodiments of the invention.
FIGS. 16B and 17B are alternative embodiments of the field effect region of FIGS. 16 and 17 respectively.
Figure 16B:
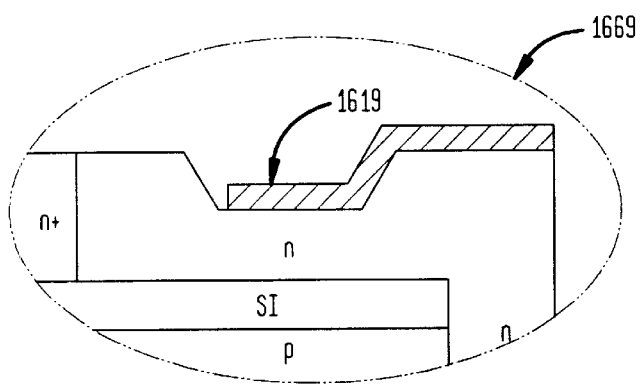

The device shown in FIG. 16 is the device analogous to the field gated bipolar transistor (FGBT) device of FIG. 10 with the difference being in the inclusion of semi-insulating layer 1663. In the FGBT device of FIG. 16, semi-insulating region 1663 is introduced on both sides of p+ subregion 1668 by converting parts of p-type layer 1658 through ion implantation, for example by ion implanting vanadium in the case of SiC devices, or by directly converting parts of n-type layer 1660 or 1646. Semi-insulating region 1663 provides the same advantages with respect to the reduction of parasitic currents as semi-insulating region 758 in the device of FIG. 14A. In particular, semi-insulating region 1663 prevents parasitic current conduction from Schottky gate contact 1618 through n-type layer 1660 and p-type layer 1658 to p+ sub region 1668. In the device of FIG. 16, n-type sub regions 1662 do not have to be ion implanted to form a heavily doped tub region as in the device of FIG. 10, but instead may be doped with a concentration the same as either the n-blocking layer 1646 or the n-type control layer 1660. Consequently, this means that the n-type sub region 1662 can be part of the epitaxially grown blocking layer 1646 or the epitaxially grown control layer 1660 when p-type layer 1658 is formed. For example, p-type layer 1658 may be formed by ion implantation of B or Al or C plus either B or Al, thereby converting n-type layer 1646 into p-type layer 1658. In FIG. 16, n+ subregion 1666, n tub region 1662, control layer (control channel) 1660, and gate 1618 form a MESFET which can be either normally-off or normally-on. In response to a selectively applied gate voltage, the tub region 1662 is alternatively depleted and undepleted, causing the FGBT to turn off and on, respectively. More specifically, for a normally-off MESFET, a gate voltage is applied to gate 1618 to reduce the depletion width and create a conducting channel so that electrons from n+ region 1666 flood the tub region, which leads to the turn-on of the device of FIG. 16. For a normally-on MESFET, a gate voltage is applied to gate 1618 to extend the depletion width and pinch-off the conducting channel, causing the tub region to be depleted, and leading to the turn-off of the device of FIG. 16. In all other respects, the FGBT device of FIG. 16 is fabricated and operated in a similar manner as the FGBT device of FIG. 10 above. As can be seen in FIG. 16, the control p-n junction has been entirely eliminated in this device as a result of the inclusion of semi-insulating layer 1663. FIG. 16B shows an alternative embodiment of MESFET 1669. The recessed Schottley gate 1619 is included to reduce the channel resistance.

Figure 17A:
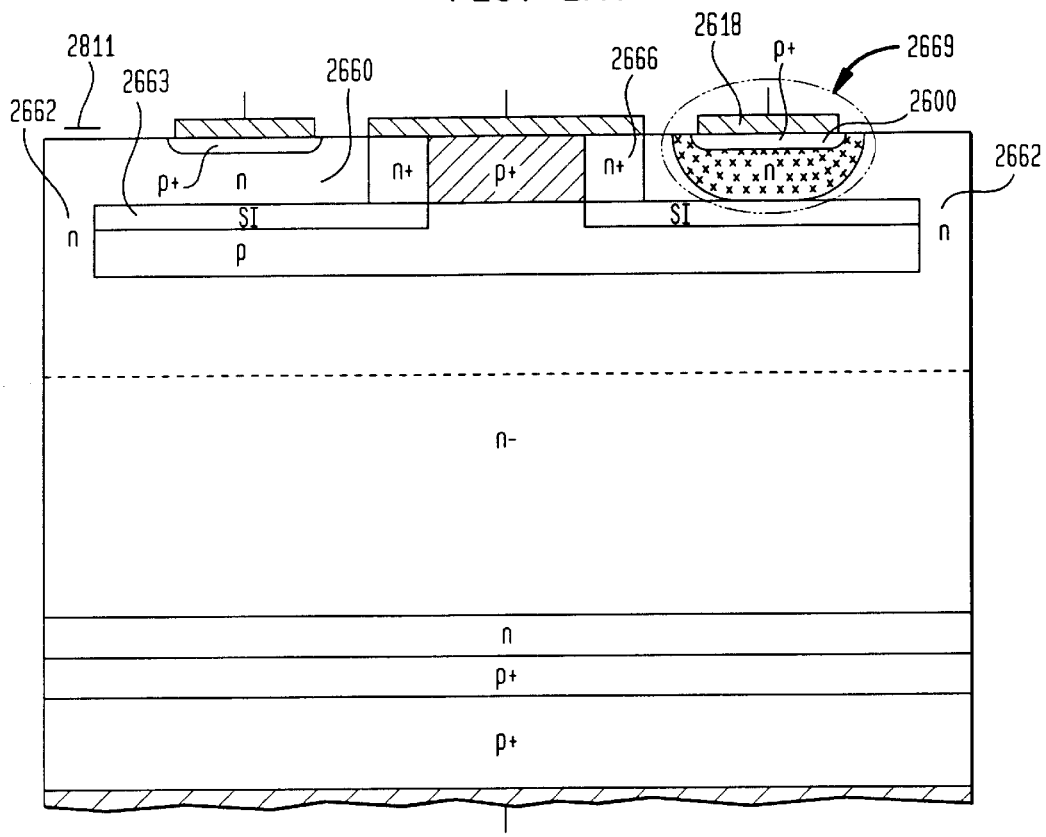
Figure 17B:
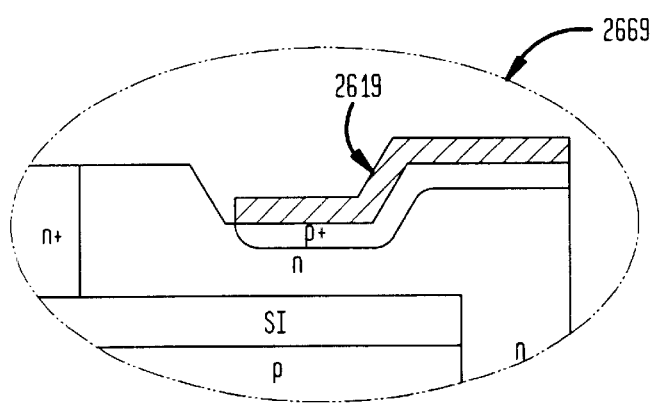

The FGBT device of FIG. 17 is fabricated and operated in a manner similar to the FGBT device of FIG. 16, with the only difference being in the fabrication and operation of the p-type region 2600 and gate contact 2618. In the device of FIG. 17, a p+ type, region 2600 is created by ion implantation and extends into control layer 2660 from top device surface 2811 between n+ sub region 2666 and n-type sub region 2662. The p+ region 2600, n+ sub region 2666, n-type sub region 2662, and control layer 2660 form either a normally-on or a normally-off junction field effect transistor (JFET) 2669 as in the device of FIG. 11. FIG. 17B shows an alternative embodiment of JFET 2669. The recessed ohmic metal gate 2619 is included to reduce the channel resistance. Because of the monolithic integration of the JFET 2669 of FIG. 17, as with the device of FIG. 15 above, the FGBT of FIG. 17 can be operated at temperatures greater than 500 degrees Celsius. Also as with the device of FIG. 15 above, the FGBT of FIG. 17 has a higher reliability than a similarly fabricated metal-oxide-field-effect transistor (MOSFET) since oxides and other insulator gate dielectrics are known to degrade semiconductor device reliability at high temperatures.

Figure 18:
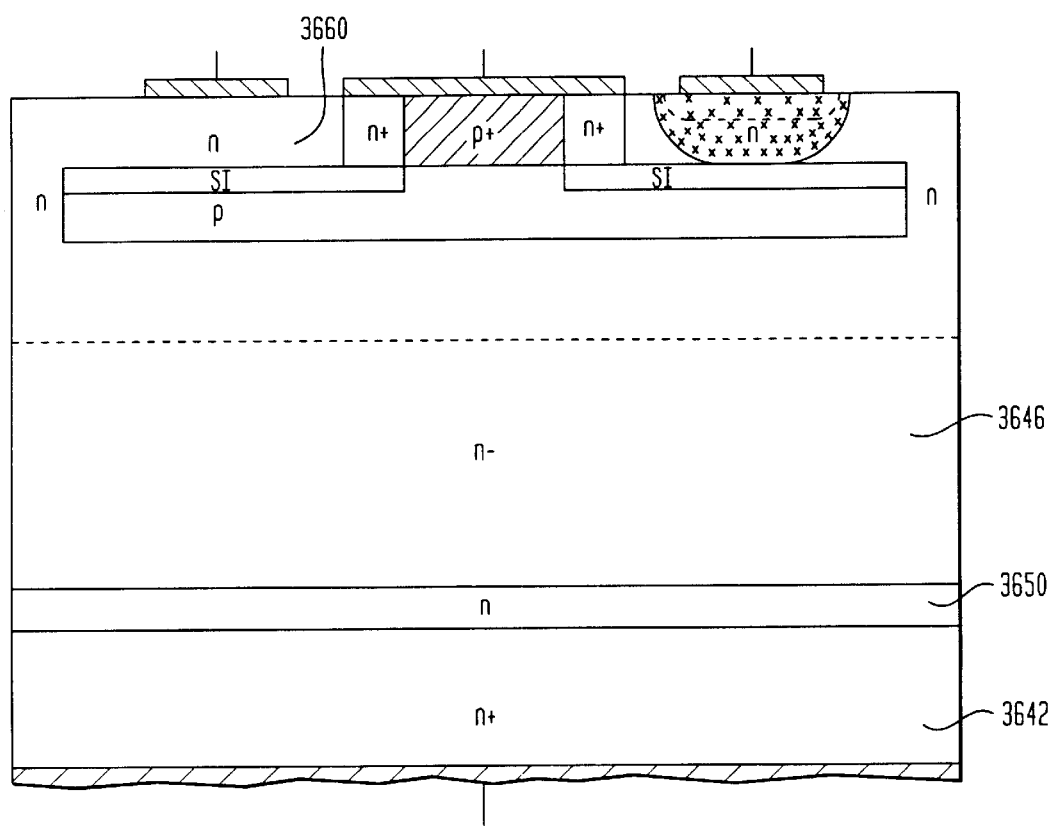
FIGS. 18 and 19 are enlarged sectional views of field-controlled transistors according to further embodiments of the invention.

The device of FIG. 18 is a field controlled transistor (FCT) similar to the device of FIG. 6. This device is fabricated and operated similarly to the FGBT device of FIG. 16, with the only difference being in the use of substrate 3642. In particular, substrate 3642 of the device of FIG. 18 is of the same n-type doping as the control layer 3660, whereas in the FGBT device of FIG. 16, the substrate 1642 is of the opposite doping type as compared to the control layer 1660. In all other respects, the FCT device of FIG. 18 operates in a manner similar to the FCT device of FIG. 6A as described above. Specifically, the tub region is alternatively depleted and undepleted in response to a selectively applied gate voltage which causes the FCT to switch off and on, respectively. The recessed gate implementation of FIG. 16B can also be used for the device of FIG. 18.

One advantage of the FCT of FIG. 18 is that it operates as a majority carrier, unipolar semiconductor device -since no minority carrier injection or carrier storage occurs in blocking layer 3646. In comparison, the FGBT device of FIG. 16 is a bipolar device since layers 1666 (n+), 1646 (n–) and 1642 (p+) operate as an n+n–p+ diode when the FGBT is in the ON-state. Consequently, the device of FIG. 16 employs minority carrier injection and storage. Thus, the devices of FIGS. 16 and 17 have current-voltage characteristics similar to that of the well-known insulated gate bipolar transistor (IGBT) while avoiding the use of $SiO_2$ or other gate dielectric materials. For high temperature and high power devices, fabricated from SiC for example, the elimination of $SiO_2$ or other gate insulators represents a major advantage due to the well known reliability concerns of gate insulators at high temperatures coupled with the low channel mobility present in SiC-based metal oxide semiconductor field effect transistors (MOSFETs) or metal-insulator semiconductor field effect transistors (MISFETs).

Figure 19:
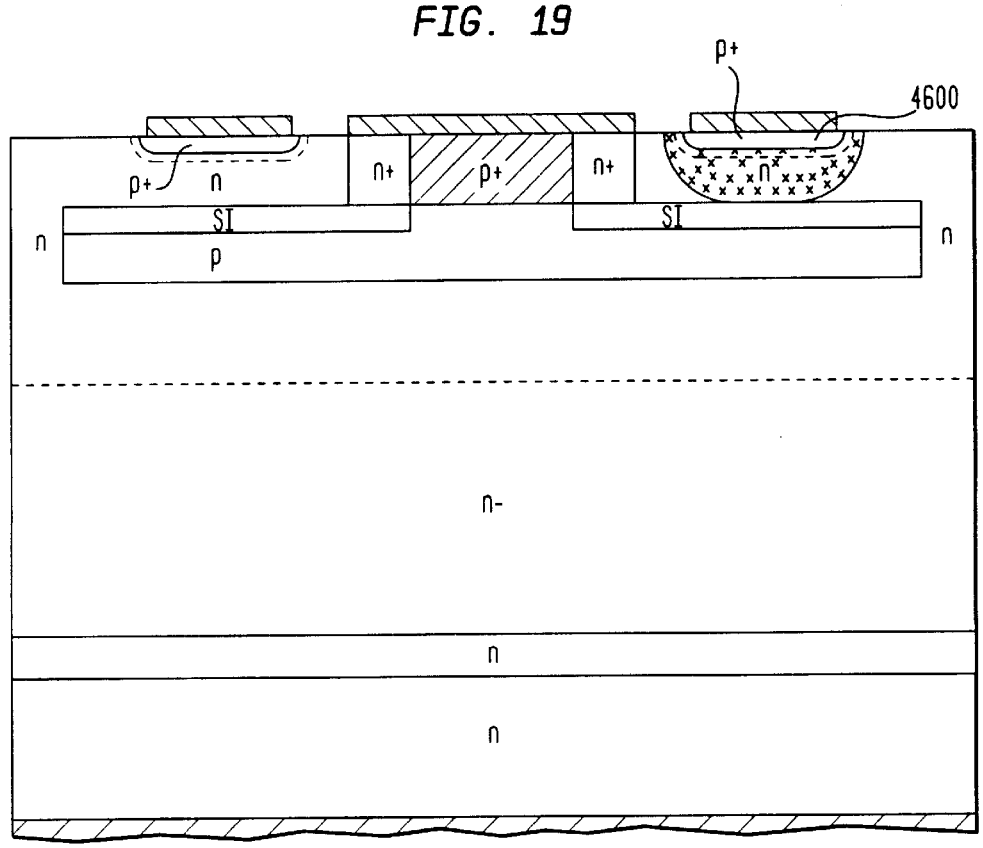

The FCT device of FIG. 19 is fabricated and operated similarly to the FGBT device of FIG. 17 with the difference between them being identical to the differences between the FCT device of FIG. 18 and the FGBT device of FIG. 16 mentioned above. The fabrication and operation of the JFET, including the p+ region 4600, is identical to that mentioned in the description of the FGBT device of FIG. 17 above. As with the FGBT device of FIG. 17, the monolithic integration of the JFET in the FCT device of FIG. 19 permits highly reliable operation of the FCT at temperatures greater than 500 degrees Celsius. The recessed gate implementation of FIG. 17B can also be used for the device of FIG. 19.

While the particular embodiments of the invention have been shown and described, it will be obvious to those skilled in the art that the specific terms and figures are employed in a generic and descriptive sense only and not for the purposes of limiting or reducing the scope of the broader inventive aspects herein. The monolithic power semiconductor structures and methods of operation of the present invention are applicable to a broad range of semiconductor devices which can be fabricated from a variety of semiconductor materials. By disclosing the preferred embodiments of the present invention above, it is not intended to limit or reduce the scope of coverage for the general applicability of the present invention to specific devices or semiconductor materials. Moreover, the disclosed embodiments employ sample semiconductor conductivity types for each layer (i.e. p-type or n-type) along with corresponding, appropriate device and gate biasing voltages. Persons of skill in the art will easily recognize the substitution of n-type for p-type and vice-versa along with appropriate corresponding changes in device and biasing voltage polarities to correctly operate the devices. Furthermore, while a single vertical power device per wafer is disclosed, other structures yielding multiple devices per wafer, such as a horizontal devices, may also be constructed according to the teachings of the present invention.

This application claims the benefit of U.S. application Ser. No. 09/095,481, filed Jun. 10, 1998, the disclosure of which is hereby incorporated by reference herein.

INDUSTRIAL APPLICABILITY

These field turn-off devices have wide-spread applications in the entire field of power electronics, such as electric motor control, powertrains for electric vehicles, power conditioning, general electric utility control, nuclear power systems.

What is claimed is:

1. A semiconductor device comprising:
   (a) a semiconductor structure having top and bottom surfaces, said structure including a plurality of semiconductor layers defining a blocking p-n junction remote from both said surfaces, said structure including a control layer defining the top surface of the structure; a top conductive region extending from said top surface; a conductive tub region spaced apart from said top conductive region and extending from said top surface toward said blocking p-n junction at least through said control layer, said control layer including a field effect region disposed between said top conductive region and said conductive tub region;
   (b) a top ohmic contact in contact with said top surface at said top conductive region;
   (c) a bottom ohmic contact in contact with said semiconductor structure below said blocking p-n junction, said semiconductor layers being arranged so that when a potential is sustained between said top and bottom ohmic contacts, a major portion of said potential appears across said blocking p-n junction thereby forming depletion regions about said blocking p-n junction, and
   (d) a gate contact overlying said field effect region, whereby conductivity of said field effect region can be selectively controlled by a controlling potential on said gate contact to create and interrupt a conductive channel within said control layer, said top conductive region and said conductive tub region being coupled and decoupled by said conductive channel, said conductive tub region extending downwardly to the vicinity of said blocking p-n junction so that a least resistive current path including said top conductive region, said conductive channel and said conductive tub region is created between said top ohmic contact and said blocking p-n junction when said conductive channel is created.

2. The semiconductor device of claim 1 further comprising a control p-n junction disposed above said blocking p-n junction and remote from said top surface, said gate contact forming a Schottky contact such that said gate contact, said field effect region, said top conductive region and said conductive tub region constitute a MESFET.

3. The semiconductor device of claim 1 further comprising a control p-n junction disposed above said blocking p-n junction and remote from said top surface, said field effect region having a gate conductive region extending from said top surface under said gate contact toward said control p-n junction such that said gate contact, said gate conductive region, said field effect region, said top conductive region and said conductive tub region constitute a JFET.

4. The semiconductor device of claim 1 further comprising a control p-n junction disposed above said blocking p-n junction and remote from said top surface, said gate contact including an insulative layer on said top surface and a conductive contact on said insulative layer such that said gate contact, said field effect region, said top conductive region and said conductive tub region constitute a MOSFET.

5. The semiconductor device of claim 1 in which said top conductive region includes a first subregion of same semiconductor type as said control layer and extending to a first depth from said top surface, a second subregion of opposite semiconductor type from said control layer extending to a second depth from said top surface and disposed between said first subregion and said field effect region, both of said subregions being in contact with said top ohmic contact, said gate contact including an insulative layer on said top surface and a conductive contact on said insulative layer such that said gate contact, said field effect region, said second subregion of said top conductive region and said conductive tub region constitute a MOSFET.

6. The semiconductor device of claim 4 or claim 5 in which said field effect region includes unimplanted epitaxially grown semiconductor defining said top surface in said field effect region, whereby said insulative layer includes an insulating compound on said unimplanted epitaxially grown semiconductor.

7. The semiconductor device of claim 1 in which said semiconductor device is a field controlled transistor, said conductive tub region extending at least to said blocking p-n junction and having a bottom end being disposed in said depletion region of said blocking p-n junction when said potential is sustained between said top and bottom ohmic contacts, said conductive tub region being alternatively depleted and undepleted of carriers in response to said selective controlling potential on said gate contact, whereby said transistor switches "off" and "on" respectively.

8. The semiconductor device of claim 7 in which said top conductive region includes a first subregion of same semiconductor type as said control layer and extending to a first depth from said top surface; a second subregion of opposite semiconductor type from said control layer extending to a second depth from said top surface and disposed between said first subregion and said field effect region, both subregions in contact with said top ohmic contact, said gate contact including an insulative layer on said top surface and a conductive contact on said insulative layer such that said gate contact, said field effect region, said second subregion of said top conductive region and said conductive tub region constitute a MOSFET.

9. The semiconductor device of claim 7 further comprising a control p-n junction disposed above said blocking p-n junction and remote from said top surface, said gate contact forming a Schottky contact such that said gate contact, said field effect region, said top conductive region and said conductive tub region constitute a MESFET.

10. The semiconductor device of claim 7 further comprising a control p-n junction disposed above said blocking p-n junction and remote from said top surface, said field effect region having a gate conductive region extending from said top surface under said gate contact toward said control p-n junction such that said gate contact, said gate conductive region, said field effect region, said top conductive region and said conductive tub region constitute a JFET.

11. The semiconductor device of claim 7 further comprising a control p-n junction disposed above said blocking p-n junction and remote from said top surface, said gate contact including an insulative layer on said top surface and a conductive contact on said insulative layer such that said gate contact, said field effect region, said top conductive region and said conductive tub region constitute a MOSFET.

12. The semiconductor device of claim 1 in which said semiconductor device is a field-gated bipolar transistor, said semiconductor structure having a lower p-n junction remote from said top and bottom surfaces and disposed below said blocking p-n junction, said conductive tub region extending at least to said blocking On junction and having a bottom end being disposed in said depletion region of said blocking p-n junction when said potential is sustained between said top and bottom ohmic contacts, said conductive tub region being alternatively depleted and undepleted in response to said selective controlling potential on said gate contact, whereby said bipolar transistor switches "off" and "on" respectively.

13. The semiconductor device of claim 12 in which said top conductive region includes a first subregion of same semiconductor type as said control layer and extending to a first depth from said top surface, a second subregion of opposite semiconductor type from said control layer extending to a second depth from said top surface and disposed between said first subregion and said field effect region, both subregions in contact with said top ohmic contact, said gate contact including an insulative layer on said top surface and a conductive contact on said insulative layer such that said gate contact, said field effect region, said second subregion of said top conductive region and said conductive tub region constitutes a MOSFET.

14. The semiconductor device of claim 13 further comprising a control p-n junction disposed above said blocking p-n junction and remote from said top surface, said gate contact forming a Schottky contact such that said gate contact, said field effect region, said top conductive region and said conductive tub region constitute a MESFET.

15. The semiconductor device of claim 13 further comprising a control p-n junction disposed above said blocking p-n junction and remote from said top surface, said field effect region having a gate conductive region extending from said top surface under said gate contact toward said control p-n junction such that said gate contact, said field effect region, said gate conductive region, said top conductive region and said conductive tub region constitute a JFET.

16. The semiconductor device of claim 13 further comprising a control p-n junction disposed above said blocking p-n junction and remote from said top surface, said gate contact including an insulative layer on said top surface and a conductive contact on said insulative layer such that said gate contact, said field effect region, said top conductive region and said conductive tub region constitute a MOSFET.

17. The semiconductor device of claim 1 in which said semiconductor device is a field turn-off thyristor;
(a) said top conductive region including a first subregion extending to a first depth from said top surface, and a second subregion extending to a second depth from said top surface and disposed between said first subregion and said field effect region, both subregions in contact with said top ohmic contact;
(b) said semiconductor structure having a lower and an upper p-n junction, both remote from said top and bottom surfaces; said lower p-n junction disposed below said blocking p-n junction, said upper On junction disposed above said blocking p-n junction, said conductive tub region extending at least through said upper p-n junction; a latch-on gate ohmic contact overlying said conductive tub region at said top surface, whereby when said conductive channel is interrupted, current flow through said conductive tub region can be selectively controlled by a controlling current applied through said latch-on gate ohmic contact to turn on said upper p-n junction and thereby switch "on" said thyristor; and whereby in an absence of said controlling current on said latch-on gate contact, said controlling potential on said gate contact can create said conductive channel to bypass said upper p-n junction and thereby switch "off" said thyristor.

18. The semiconductor device of claim 17 in which said first subregion is of same semiconductor type as said control layer, said second subregion is of opposite semiconductor type from said control layer, said gate contact including an insulative layer on said top surface and a conductive contact on said insulative layer such that said gate contact, said field effect region, said second subregion of said top conductive region and said conductive tub region constitute a MOSFET.

19. The semiconductor device of claim 18 further comprising a control p-n junction disposed above said upper p-n junction and remote from said top surface, said first subregion being of opposite semiconductor type from said control layer, said second subregion of same semiconductor type as said control layer, said first depth of said first subregion extending beyond said control p-n junction from said top surface, said gate contact forming a Schottky contact such that said gate contact, said field effect region, said second subregion of said top conductive region and said conductive tub region constitute a MESFET.

20. The semiconductor device of claim 18 further comprising a control p-n junction disposed above said upper p-n junction and remote from said top surface, said first subregion being of opposite semiconductor type from said control layer, said second subregion of same semiconductor type as said control layer, said first depth of said first subregion extending beyond said control p-n junction from said top surface, said field effect region further comprises a gate conductive region extending from said top surface under said gate contact toward said control p-n junction such that said gate contact, said field effect region, said gate conductive region, said second subregion of said top conductive region and said conductive tub region constitute a JFET.

21. The semiconductor device of claim 18 further comprising a control p-n junction disposed above said upper p-n junction and remote from said top surface, said first subregion being of opposite semiconductor type from said control layer, said second subregion of same semiconductor type as said control layer, said first depth of said first subregion extending beyond said control p-n junction from said top surface, said gate contact including an insulative layer on said top surface and a conductive contact on said insulative layer such that said gate contact, said field effect region, said second subregion of said top conductive region and said conductive tub region constitute a MOSFET.

22. The semiconductor device of claim 12 or claim 17 in which said semiconductor structure further comprises a blocking layer of relatively low doping concentration disposed below said blocking p-n junction and an enhancement layer of same semiconductor type and relatively higher doping concentration as said blocking layer disposed above said lower p-n junction.

23. The semiconductor device of any one of claims 2, 3, 4, 9, 10, 11, 14, 15, or 16 in which said top conductive region includes a first subregion of opposite semiconductor type from said control layer and extending through said control p-n junction from said top surface, and a second subregion of the same semiconductor type as said control layer extending to a second depth from said top surface and disposed between said first subregion and said field effect region, both of said subregions in contact with said top ohmic contact.

24. The semiconductor device of claim 1 in which said semiconductor layers are composed of a material selected from the group consisting of SiC, Si, Diamond, GaAs, GaN, AlN, AlGaN, InGaN, GaP, AlGaP or AlGaAsP and combinations thereof.

25. The semiconductor device of claim 1 in which said semiconductor layers include a bottom layer, said bottom layer being in contact with said bottom ohmic contact and further including a buffer layer for improving said semiconductor structure quality.

26. The semiconductor device of claim 1 in which said semiconductor device has no insulative layer as part of said gate contact.

27. The semiconductor device of claim 1 further comprising a control p-n junction disposed above said blocking p-n junction and remote from said top surface, said field effect region including an unimplanted portion of said control layer.

28. The semiconductor device of claim 1 further comprising a control p-n junction disposed above said blocking pan junction and remote from said top surface; an upper p-n junction disposed between said blocking p-n junction and said control p-n junction.

29. The semiconductor device of claim 1 further comprising a lower p-n junction disposed below said blocking p-n junction and remote from said bottom surface.

30. The semiconductor device of claim 1 in which said top conductive region includes a first subregion of opposite semiconductor type from said control layer extending to a first depth at least through said control layer from said top surface; a second subregion of the same semiconductor type as said control layer extending to a second depth not through said control layer from said top surface and disposed between said first subregion and said field effect region, said first and second subregions being in contact with said top ohmic contact.

31. The semiconductor device of claim 1 in which said top conductive region includes a first subregion of same semiconductor type as said control layer extending to a first depth not through said control layer from said top surface; a second subregion of opposite semiconductor type from said control layer and extends to a second depth, shallower than said first depth, from said top surface and disposed between said first subregion and said field effect region, both subregions being in contact with said top ohmic contact.

32. The semiconductor device of claim 1 in which said conductive tub region extends at least to said blocking p-n junction and has a bottom end disposed in said depletion region of said blocking p-n junction when said potential is sustained between said top and bottom ohmic contacts such that said field effect region is shielded from said potential.

33. The semiconductor device of claim 1 further comprising a latch-on gate ohmic contact overlying said conductive tub region at said top surface.

34. The semiconductor device of claim 1 further comprising a lower and an upper p-n junction, both remote from said top and bottom surfaces, said lower p-n junction disposed below said blocking p-n junction, said upper p-n junction disposed above said blocking p-n junction, said conductive tub region extending through said upper p-n junction; a latch-on gate ohmic contact overlaying said conductive tub region at said top surface, said semiconductor layers being of relative conductivity, whereby a latch-on current applied at said latch-on gate ohmic contact, flows through said conductive tub region and laterally beneath said upper p-n junction before traversing said upper p-n junction beneath said top ohmic contact.

35. The semiconductor device of claim 1 further comprising a semi-insulating layer disposed directly beneath said control layer and said field effect region; said conductive tub region extending at least through said semi-insulating layer, whereby said field effect region within said control layer is electrically isolated by said semi-insulating layer from a semiconductor layer directly beneath said semi-insulating layer in a direction perpendicular to said top surface.

36. The semiconductor device of claim 35 wherein said gate contact forms a Schottky contact such that said gate contact, said field effect region, said top conductive region and said conductive tub region constitute a MESFET.

37. The semiconductor device of claim 35 wherein said field effect region further includes a gate conductive region extending from said top surface under said gate contact toward said semi-insulating layer such that said gate contact, said gate conductive region, said field effect region, said top conductive region and said conductive tub region constitute a JFET.

38. The semiconductor device of claim 35 in which said semiconductor device is a field controlled transistor, said conductive tub region extending at least to said blocking p-n junction and having a bottom end being disposed in said depletion region of said blocking p-n junction when said potential is sustained between said top and bottom ohmic contacts, said conductive tub region being alternatively depleted and undepleted in response to said selective controlling potential on said gate contact, whereby said transistor switches "off" and "on" respectively.

39. The semiconductor device of claim 38 in which said conductive tub comprises a part of a blocking layer defining a lower semiconductor layer of said blocking p-n junction.

40. The semiconductor device of claim 38 in which said conductive tub comprises a part of said control layer.

41. The semiconductor device of claim 38 in which said conductive tub comprises an ion implanted region extending from said top surface.

42. The semiconductor device of claim 38 in which said gate contact forms a Schottky contact such that said gate contact, said field effect region, said top conductive region and said conductive tub region constitute a MESFET.

43. The semiconductor device of claim 38 in which said field effect region further comprises a gate conductive region extending from said top surface under said gate contact toward said semi-insulating layer such that said gate contact, said gate conductive region, said field effect region, said top conductive region and said conductive tub region constitute a JFET.

44. The semiconductor device of claim 35 in which said semiconductor device is a field-gated bipolar transistor, said semiconductor structure having a lower p-n junction remote from said top and bottom surfaces and disposed below said blocking p-n junction, said conductive tub region extending at least to said blocking p-n junction and having a bottom end being disposed in said depletion region of said blocking p-n junction when said potential is sustained between said top and bottom ohmic contacts, said conductive tub region being alternatively depleted and undepleted in response to said selective controlling potential on said gate contact, whereby said bipolar transistor switches "off" and "on" respectively.

45. The semiconductor device of claim 44 in which said conductive tub comprises a part of a blocking layer defining a lower semiconductor layer of said blocking p-n junction.

46. The semiconductor device of claim 44 in which said conductive tub comprises a part of said control layer.

47. The semiconductor device of claim 44 in which said conductive tub comprises an ion implanted region extending from said top surface.

48. The semiconductor device of claim 44 in which said gate contact forms a Schottky contact such that said gate contact, said field effect region, said top conductive region and said conductive tub region constitute a MESFET.

49. The semiconductor device of claim 44 in which said field effect region further comprises a gate conductive region extending from said top surface under said gate contact toward said semi-insulating layer such that said gate contact, said gate conductive region, said field effect region, said top conductive region and said conductive tub region constitute a JFET.

50. The semiconductor device of claim 35 in which said semiconductor device is a field turn-off thyristor;
   (a) said top conductive region including a first subregion extending to a first depth and at least through said semi-insulating layer from said top surface, and a second subregion extending to a second depth from said top surface, said second subregion disposed between said first subregion and said field effect region, both subregions in contact with said top ohmic contact;
   (b) said semiconductor structure having a lower and an upper p-n junction, both remote from said top and bottom surfaces; said lower p-n junction disposed below said blocking p-n junction, said upper p-n junction disposed above said blocking p-n junction and beneath said first subregion; a latch-on gate ohmic contact overlying said conductive tub region at said top surface,
   whereby when said conductive channel is interrupted, current flow through said conductive tub region can be selectively controlled by a controlling current applied through said latch-on gate ohmic contact to turn on said upper p-n junction and thereby switch "on" said thyristor; and whereby in an absence of said controlling current on said latch-on gate contact, said controlling potential on said gate contact can create said conductive channel to bypass said upper p-n junction and thereby switch "off" said thyristor.

51. The semiconductor device of claim 50 wherein said first subregion is of opposite semiconductor type from said control layer and said second subregion is of same semiconductor type as said control layer.

52. The semiconductor device of claim 50 in which said gate contact forms a Schottky contact such that said gate contact, said field effect region, said second subregion of said top conductive region and said conductive tub region constitute a MESFET.

53. The semiconductor device of claim 50 in which said field effect region further comprises a gate conductive region extending from said top surface under said gate contact toward said semi-insulating layer such that said gate contact, said field effect region, said gate conductive region, said second subregion of said top conductive region and said conductive tub region constitute a JFET.

54. The semiconductor device of claim 50 in which said semiconductor structure further comprises a blocking layer of relatively low doping concentration disposed below said blocking p-n junction and an enhancement layer of same semiconductor type and relatively higher doping concentration as said blocking layer disposed above said lower p-n junction.

55. The semiconductor device of any one of claims 36, 37, 42, 43, 48, 49, 52 or 53 in which said top conductive region includes a first subregion of opposite semiconductor type from said control layer and extending to a first depth at least through said control layer from said top surface, and a second subregion of the same semiconductor type as said control layer and extending to a second depth from said top surface and disposed between said first subregion and said field effect region, both of said subregions in contact with said top ohmic contact.

56. The semiconductor device of claim 35 in which said semiconductor layers are composed of a material selected from the group consisting of SiC, Si, Diamond, GaAs, GaN, AlN, AlGaN, InGaN, GaP, AlGaP or AlGaAsP and combinations thereof.

57. The semiconductor device of claim 35 in which said semiconductor layers include a bottom layer, said bottom layer being in contact with said bottom ohmic contact and further including a buffer layer for improving said semiconductor structure quality.

58. The semiconductor device of claim 35 in which said semiconductor device has no insulative layer as part of said gate contact.

59. The semiconductor device of claim 35 further comprising a lower p-n junction disposed below said blocking p-n junction and remote from said bottom surface.

60. The semiconductor device of claim 55 further comprising an upper p-n junction disposed above said blocking p-n junction, below said first subregion and remote from said top surface.

61. The semiconductor device of claim 35 in which said conductive tub region extends at least to said blocking p-n junction and has a bottom end disposed in said depletion region of said blocking p-n junction when said potential is sustained between said top and bottom ohmic contacts such that said field effect region is shielded from said potential.

62. The semiconductor device of claim 35 further comprising a latch-on gate ohmic contact overlying said conductive tub region at said top surface.

63. The semiconductor device of claim 35 further comprising a lower and an upper p-n junction, both remote from said top and bottom surfaces, said lower p-n junction disposed below said blocking p-n junction, said upper p-n junction disposed above said blocking An junction, said conductive tub region extending to a distance further from said top surface than said upper p-n junction; a latch-on gate ohmic contact overlaying said conductive tub region at said top surface, said semiconductor layers being of relative conductivity, whereby a latch-on current applied at said latch-on gate ohmic contact, flows through said conductive tub region and laterally beneath said upper p-n junction before traversing said upper p-n junction beneath said top ohmic contact.

64. The method of operating a semiconductor device having a plurality of semiconductor layers, a top and bottom surface and including a control layer defining the top layer of the device, said method comprising the steps of:
  (a) applying a voltage between a top and a bottom ohmic contact of said semiconductor device;
  (b) sustaining said voltage across a blocking p-n junction defined by said semiconductor layers and remote from said top and bottom surfaces;
  (c) selectively creating or interrupting a conductive channel in said control layer between a top conductive region, disposed below said top ohmic contact, and a tub conductive region, spaced apart from said top conductive region and extending at least to said blocking p-n junction, by applying a control potential to a gate contact disposed over said control layer so as to cause a least resistive path including said top conductive region, said conductive channel and said conductive tub region to be created between said top ohmic contact and said blocking p-n junction when said conductive channel is created.

65. The method of operating a semiconductor device having a plurality of semiconductor layers, a top and bottom surface and including a control layer defining the top layer of the device, said method comprising the steps of:
  (a) applying a voltage between a top and a bottom ohmic contact of said semiconductor device;
  (b) sustaining said voltage across a blocking p-n junction defined by said semiconductor layers and remote from said top and bottom surfaces;
  (c) selectively applying a control current to a latch-on gate contact disposed over a tub conductive region, said tub conductive region extending through an upper p-n junction defined by said semiconductor layers and remote from said top and bottom surfaces, said upper p-n junction being disposed above said blocking p-n junction and being selectively turned on when said control current is selectively applied to said latch-on gate;
  (d) selectively creating or interrupting a conductive channel in said control layer between a top conductive region, disposed below said top ohmic contact, and a tub conductive region, spaced apart from said top conductive region and extending through said upper p-n junction, by applying a control potential to a gate contact disposed over said control layer so as to selectively short-circuit said upper p-n junction when said conductive channel is created thereby turning off said thyristor semiconductor device.

* * * * *

UNITED STATES PATENT AND TRADEMARK OFFICE
CERTIFICATE OF CORRECTION

PATENT NO. : 6,423,986 B1
DATED : July 23, 2002
INVENTOR(S) : Jian H. Zhao

It is certified that error appears in the above-identified patent and that said Letters Patent is hereby corrected as shown below:

Column 5,
Line 52, after "thereof" insert -- . --.

Column 8,
Line 48, delete "gm" and insert therefor -- µm --.

Column 21,
Line 26, delete "On" and insert therefor -- p-n --.

Column 22,
Line 12, delete "On" and insert therefor -- p-n --.

Column 23,
Line 40, delete "pan" and insert therefor -- p-n --.

Column 26,
Line 58, delete "An" and insert therefor -- p-n --.

Signed and Sealed this

Tenth Day of December, 2002

JAMES E. ROGAN
*Director of the United States Patent and Trademark Office*